(12) United States Patent
Maruyama et al.

(10) Patent No.: US 10,451,970 B2
(45) Date of Patent: *Oct. 22, 2019

(54) SILICONE SKELETON-CONTAINING POLYMER, PHOTO-CURABLE RESIN COMPOSITION, PHOTO-CURABLE DRY FILM, LAMINATE, AND PATTERNING PROCESS

(71) Applicant: SHIN-ETSU CHEMICAL CO., LTD., Tokyo (JP)

(72) Inventors: Hitoshi Maruyama, Annaka (JP); Kazunori Kondo, Takasaki (JP); Michihiro Sugo, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 17 days.

This patent is subject to a terminal disclaimer.

(21) Appl. No.: 15/466,000

(22) Filed: Mar. 22, 2017

(65) Prior Publication Data
US 2018/0004088 A1   Jan. 4, 2018

(30) Foreign Application Priority Data

Jun. 30, 2016   (JP) ................. 2016-130447

(51) Int. Cl.
| | | |
|---|---|---|
| G03F 7/075 | (2006.01) | |
| B32B 3/26 | (2006.01) | |
| B32B 3/30 | (2006.01) | |
| B32B 27/28 | (2006.01) | |
| C08J 5/18 | (2006.01) | |
| C09J 183/14 | (2006.01) | |
| G03F 7/004 | (2006.01) | |
| G03F 7/16 | (2006.01) | |
| G03F 7/20 | (2006.01) | |

(Continued)

(52) U.S. Cl.
CPC ............ *G03F 7/0757* (2013.01); *B32B 3/266* (2013.01); *B32B 3/30* (2013.01); *B32B 27/28* (2013.01); *C08G 59/22* (2013.01); *C08J 5/18* (2013.01); *C08K 3/36* (2013.01); *C08L 83/10* (2013.01); *C08L 83/14* (2013.01); *C09D 183/10* (2013.01); *C09D 183/14* (2013.01); *C09J 183/14* (2013.01); *G03F 7/0045* (2013.01); *G03F 7/038* (2013.01); *G03F 7/0384* (2013.01); *G03F 7/161* (2013.01); *G03F 7/168* (2013.01); *G03F 7/2002* (2013.01); *G03F 7/325* (2013.01); *G03F 7/38* (2013.01); *G03F 7/40* (2013.01); *H01L 23/296* (2013.01); *H01L 23/49894* (2013.01); *H01L 24/83* (2013.01); *B32B 2457/14* (2013.01); *C08G 77/14* (2013.01); *C08G 77/455* (2013.01); *C08G 77/52* (2013.01); *C08G 77/54* (2013.01); *C08G 77/80* (2013.01); *C08J 2383/14* (2013.01); *H01L 2224/83855* (2013.01); *H01L 2924/0715* (2013.01)

(58) Field of Classification Search
CPC ............................. C08G 77/455; C08G 77/52
See application file for complete search history.

(56) References Cited

U.S. PATENT DOCUMENTS

| 3,159,601 A | 12/1964 | Ashby |
|---|---|---|
| 3,159,662 A | 12/1964 | Ashby |

(Continued)

FOREIGN PATENT DOCUMENTS

| EP | 1 484 353 A1 | 12/2004 |
|---|---|---|
| EP | 2 602 661 A1 | 6/2013 |

(Continued)

OTHER PUBLICATIONS

A more complete English translation of JP 2003-20337 a obtained Mar. 15, 2009 from the JPO website .29 pages. (Year: 2003).*

(Continued)

*Primary Examiner* — Cynthia Hamilton
(74) *Attorney, Agent, or Firm* — Oliff PLC

(57) ABSTRACT

The present invention provides a silicone skeleton-containing polymer including a silicone skeleton shown by the following formula (1) and having a weight average molecular weight of 3,000 to 500,000.

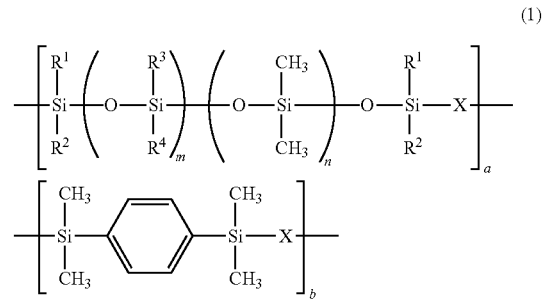

(1)

This can provide a silicone skeleton-containing polymer that can easily form a fine pattern with a large film thickness, and can form a cured material layer (cured film) that is excellent in various film properties such as crack resistance and adhesion properties to a substrate, electronic parts, and a semiconductor device, particularly a base material used for a circuit board, and has high reliability as a film to protect electric and electronic parts and a film for bonding substrates; and a photo-curable resin composition that contains the polymer, a photo-curable dry film thereof, a laminate using these materials, and a patterning process.

19 Claims, No Drawings

(51) Int. Cl.
| | |
|---|---|
| *G03F 7/32* | (2006.01) |
| *G03F 7/38* | (2006.01) |
| *G03F 7/40* | (2006.01) |
| *H01L 23/29* | (2006.01) |
| *H01L 23/498* | (2006.01) |
| *H01L 23/00* | (2006.01) |
| *C09D 183/10* | (2006.01) |
| *C09D 183/14* | (2006.01) |
| *C08L 83/10* | (2006.01) |
| *C08L 83/14* | (2006.01) |
| *G03F 7/038* | (2006.01) |
| *C08G 59/22* | (2006.01) |
| *C08K 3/36* | (2006.01) |
| *C08G 77/52* | (2006.01) |
| *C08G 77/00* | (2006.01) |
| *C08G 77/54* | (2006.01) |
| *C08G 77/14* | (2006.01) |
| *C08G 77/455* | (2006.01) |

(56) References Cited

U.S. PATENT DOCUMENTS

| | | | |
|---|---|---|---|
| 3,220,972 A | | 11/1965 | Lamoreaux |
| 3,775,452 A | | 11/1973 | Karstedt |
| 8,889,810 B2 | * | 11/2014 | Takeda ............... C08G 77/14 |
| | | | 528/26 |
| 10,308,787 B2 | * | 6/2019 | Kondo ................ C08L 83/14 |
| 2004/0048997 A1 | | 3/2004 | Sugo |
| 2004/0126504 A1 | * | 7/2004 | Ouchi ................ C08G 77/485 |
| | | | 428/1.1 |
| 2008/0182087 A1 | | 7/2008 | Kato et al. |
| 2011/0143092 A1 | * | 6/2011 | Asai ..................... C08G 77/52 |
| | | | 428/141 |
| 2011/0143103 A1 | | 6/2011 | Furuya et al. |
| 2013/0196114 A1 | | 8/2013 | Urano et al. |
| 2017/0283581 A1 | * | 10/2017 | Kondo ................ H01L 23/296 |
| 2018/0004088 A1 | * | 1/2018 | Maruyama ............ C08G 59/22 |
| 2018/0179355 A1 | * | 6/2018 | Tomizawa ................ C08J 5/24 |

FOREIGN PATENT DOCUMENTS

| | | |
|---|---|---|
| JP | 2002-088158 A | 3/2002 |
| JP | 2003-020337 A | 1/2003 |
| JP | 2004-099638 A | 4/2004 |
| JP | 2008-184571 A | 8/2008 |
| JP | 2011-123277 A | 6/2011 |
| JP | 2013-173920 A | 9/2013 |
| JP | 2014-122276 A | 7/2014 |

OTHER PUBLICATIONS

Aug. 30, 2017 Extended Search Report issued in Europena Patent Application No. 17000567.2.

Apr. 2, 2019 Office Action issued in Japanese Application No. 2016-130447.

* cited by examiner

SILICONE SKELETON-CONTAINING POLYMER, PHOTO-CURABLE RESIN COMPOSITION, PHOTO-CURABLE DRY FILM, LAMINATE, AND PATTERNING PROCESS

TECHNICAL FIELD

The present invention relates to a new silicone skeleton-containing polymer and a photo-curable resin composition that can be used as a material for a film to protect electric and electronic parts and a material for a film for bonding substrates, for example; a dry film thereof, and a patterning process using these materials, and a laminate using this composition or dry film.

BACKGROUND ART

Previously, photosensitive polyimide compositions, photosensitive epoxy resin compositions, and photosensitive silicone compositions have been utilized as photosensitive protective films for semiconductor devices and insulator films for multilayer print substrates. Among them, the photosensitive silicone compositions, which are particularly superior in flexibility, have been proposed as the photosensitive materials applied to protection of such substrates and circuits (Patent Literature 1). This photosensitive silicone composition can be cured at lower temperature, and forms a film with high reliability such as wet adhesion resistance. On the other hand, this shows inferior chemical resistance to a photoresist stripping solution with strong solubility such as N-methyl-2-pyrroridone.

On the other hand, it has been proposed a photosensitive silicone composition mainly composed of a silphenylene skeleton-containing silicone type polymer (Patent Literature 2). The photosensitive silicone composition has improved chemical resistivity to a photoresist stripper and so on. In a heat cycle test (repeating 1000 cycles of holding at −25° C. for 10 minutes and holding at 125° C. for 10 minutes), however, the cured material can be delaminated from the substrate or can have cracks. Accordingly, it has been demanded for further improving the reliability.

CITATION LIST

Patent Literature

Patent Literature 1: Japanese Unexamined Patent Application publication (Kokai) No. 2002-88158
Patent Literature 4-2: Japanese Unexamined Patent Application publication (Kokai) No. 2008-184571

SUMMARY OF INVENTION

Technical Problem

The present invention was accomplished in view of the above-described circumstances. It is an object of the present invention to provide a silicone skeleton-containing polymer that can easily form a fine pattern with a large film thickness, and can form a cured material layer (cured film) that is excellent in various film properties such as crack resistance and adhesion properties to a substrate, electronic parts, and a semiconductor device, particularly a base material used for a circuit board, and has high reliability as a film to protect electric and electronic parts and a film for bonding substrates; and a photo-curable resin composition that contains the polymer, a photo-curable dry film thereof, a laminate using these materials, and a patterning process.

Solution to Problem

To solve the foregoing problems, the present invention provides a silicone skeleton-containing polymer comprising a silicone skeleton shown by the following formula (1) and having a weight average molecular weight of 3,000 to 500,000,

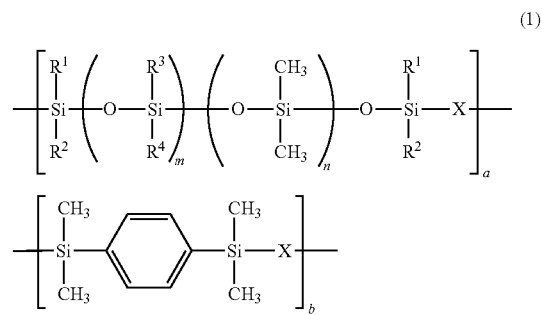

[wherein $R^1$ to $R^4$ each independently represent a monovalent hydrocarbon group having 1 to 8 carbon atoms; "m" and "n" are each independently an integer of 0 to 300; the both of "a" and "b" are positive numbers satisfying a+b=1; each of "X" independently represents a linking group selected from the divalent groups shown by the following general formulae (2), (3), (4), (5), and (6), and when the molar numbers of units shown by the following general formulae (2), (3), (4), (5), and (6) are defined as "c", "d", "e", "f", and "g" respectively, each of "c", "d", "e", and "g" is 0 or a positive number, and "f" is a positive number, with the proviso that c+d+e is a positive number,

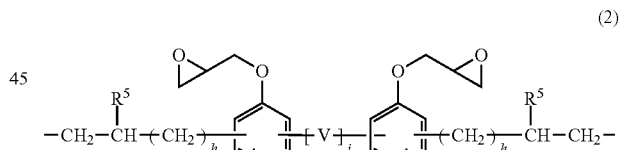

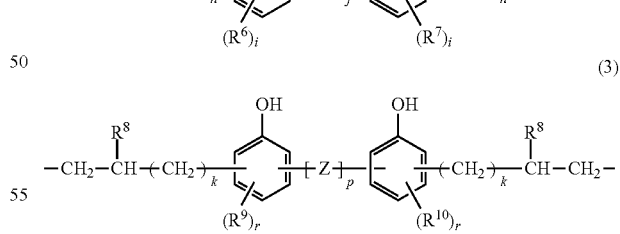

(wherein "V" and "Z" each independently represent a divalent organic group selected from the following

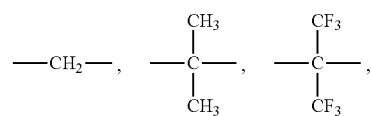

-continued

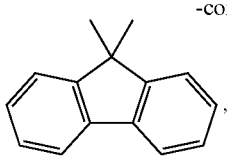

"j" and "p" are each independently 0 or 1, $R^5$ and $R^8$ each independently represents a hydrogen atom or a methyl group, "h" and "k" are each independently an integer of 0 to 7, $R^6$, $R^7$, $R^9$, and $R^{10}$ each independently represent the same or different group selected from alkyl groups and alkoxy groups having 1 to 4 carbon atoms, and "i" and "r" are each independently any of 0, 1, and 2);

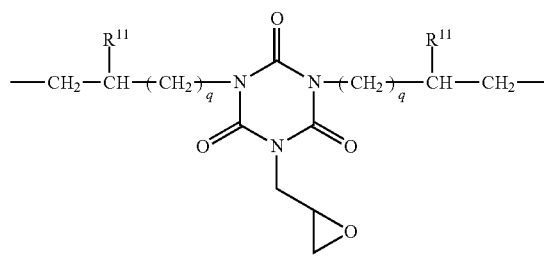

(4)

(wherein $R^{11}$ represents a hydrogen atom or a methyl group, and "q" is an integer of 0 to 7),

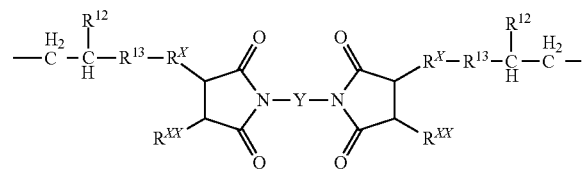

(5)

(wherein "Y" is a divalent organic group, each of $R^{12}$ independently represents the same or different moiety selected from a hydrogen atom, monovalent hydrocarbon groups having 1 to 8 carbon atoms, and monovalent hydrocarbon groups having 1 to 8 carbon atoms partly substituted with a halogen atom, each of $R^{13}$ independently represents the same or different alkylene group having 1 to 8 carbon atoms, $R^x$ is a single bond or a group to form a ring structure with $R^{xx}$ by ring closure, and $R^{xx}$ is a hydrogen atom or a monovalent hydrocarbon group having 1 to 8 carbon atoms), The inventive silicone skeleton-containing polymer described above functions to give sufficient film formability. The composition using this polymer gives a photo-curable resin layer that has excellent adhesion properties to a substrate, electronic parts, and a semiconductor device; as well as good pattern formability, crack resistance, and excellent heat resistance.

In this case, it is preferable that the general formula (5) be the following formula (5-1)

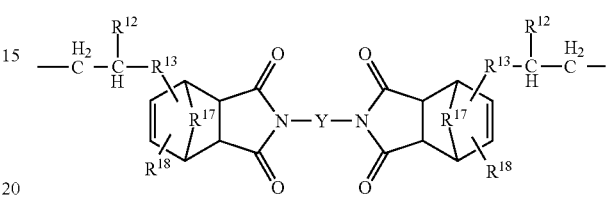

(5-1)

(wherein "Y", $R^{12}$, and $R^{13}$ are the same as above, each of $R^{17}$ independently represents the same or different alkylene group having 1 to 8 carbon atoms, and each of $R^{18}$ independently represents the same or different moiety selected from a hydrogen atom, monovalent hydrocarbon groups having 1 to 8 carbon atoms, and monovalent hydrocarbon groups having 1 to 8 carbon atoms partly substituted with a halogen atom).

Such a silicone skeleton-containing polymer can be easily synthesized and is preferable.

The present invention also provides a photo-curable resin composition comprising:
the foregoing silicone skeleton-containing polymer (A), and
a photo-acid generator (B) that is decomposed by light having a wavelength of 190 to 500 nm to generate an acid.

Such a photo-curable resin composition can easily form a fine pattern with a large film thickness and excellent vertical; and can form a cured material layer that is excellent in adhesion properties to a substrate, electronic parts, and a semiconductor device, particularly a base material used for a circuit board, mechanical properties, and electric insulation, and has high reliability as an insulating protective film and excellent crack resistance.

In this case, it is preferable that the photo-curable resin composition further contain a crosslinking agent (C).

The photo-curable resin composition that contains a crosslinking agent (C) can form a pattern more easily, and can further enhance the strength of the cured material.

In this case, the crosslinking agent (C) can be any one or more species selected from amino condensates modified

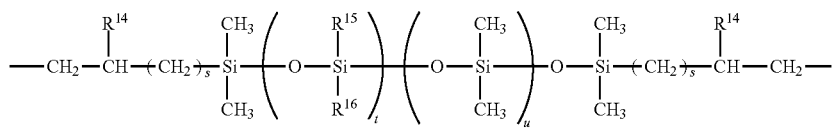

(6)

(wherein "t" and "u" are each independently an integer of 0 to 300, $R^{14}$ represents a hydrogen atom or a methyl group, $R^{15}$ and $R^{16}$ each independently represent a monovalent hydrocarbon group having 1 to 8 carbon atoms, and "s" is an integer of 0 to 7)].

with formaldehyde or formaldehyde-alcohol, phenol compounds having on average two or more methylol groups or alkoxy methylol groups in a molecule thereof, and epoxy compounds having on average two or more epoxy groups in a molecule thereof.

Such a crosslinking agent (C) can enhance the strength of the cured material much more, and is preferable.

In this case, it is preferable that the photo-curable resin composition further contain a solvent (D).

By containing a solvent (D) as described above, the application properties of the photo-curable resin composition is improved.

In this case, it is preferable that the photo-curable resin composition further contain a basic compound (E).

By containing a basic compound (E) as described above, it is possible to improve the resolution, to suppress the sensitivity change after exposure, to reduce the dependency on a substrate and an environment, and to improve the exposure latitude and the pattern shape.

The present invention also provides a photo-curable dry film comprising:

a support film, and a photo-curable resin layer of the foregoing photo-curable resin composition being applied onto the support film and dried.

The photo-curable resin layer in such a photo-curable dry film can give a cured material layer that is excellent in adhesion properties to a substrate, electronic parts, and a semiconductor device, particularly a base material used for a circuit board, mechanical properties, electric insulation, and crack resistance.

The present invention also provides a laminate comprising:

a substrate having either or both of a trench and a hole with an aperture width of 10 to 100 μm and a depth of 10 to 120 μm, and a cured material layer made from the foregoing photo-curable resin composition or a cured material layer of the photo-curable resin layer in the foregoing photo-curable dry film, being formed on the substrate.

Such a laminate is excellent in adhesion properties between the cured material layer and a substrate, and has high flatness even when the substrate has such unevenness as described above.

The present invention also provides a patterning process, comprising:

(i) a step of applying the foregoing photo-curable resin composition onto a substrate to form a photo-curable resin layer on the substrate, (ii) a step of exposing the photo-curable resin layer via a photomask, and (iii) a step of development by using a developer after heat treatment subsequent to the exposing, thereby dissolving and removing an unexposed portion to form a pattern.

The present invention also provides a patterning process, comprising:

(i) a step of bringing the foregoing photo-curable dry film into close contact with a substrate to form the photo-curable resin layer on the substrate, (ii) a step of exposing the photo-curable resin layer via a photomask, and (iii) a step of development by using a developer after heat treatment subsequent to the exposing, thereby dissolving and removing an unexposed portion to form a pattern.

Such a patterning process using the inventive photo-curable resin composition or photo-curable dry film makes it possible to easily form a fine pattern with a large film thickness.

In this case, it is preferable to include (iv) a step of subjecting a film patterned by the development to post-cure at a temperature of 100 to 250° C.

Such post-cure can increase the crosslink density of the photo-curable resin composition, can remove the remaining volatile components, and can further improve the adhesion properties to a substrate and so on, the heat resistance, the strength, the electrical properties, and the bond strength.

In this case, it is preferable that the substrate have either or both of a trench and a hole with an aperture width of 10 to 100 μm and a depth of 10 to 120 μm.

As described above, the inventive photo-curable resin composition and photo-curable dry film can be favorably used for forming a cured material layer onto a substrate having unevenness.

The photo-curable resin composition can be a material for a film to protect electric and electronic parts.

The photo-curable resin composition can be a material for a film for bonding two substrates.

The inventive photo-curable resin composition is excellent in various film properties such as adhesion properties and crack resistance, and can be used for a material for a film to protect electric and electronic parts and a material for a film for bonding substrates.

Advantageous Effects of Invention

The inventive silicone skeleton-containing polymer as well as the photo-curable resin composition and the photo-curable dry film using the polymer can easily form a fine pattern with a large film thickness, and shows sufficient properties as a photosensitive material. The cured material layer is excellent in adhesion properties to a substrate, electronic parts, and a semiconductor device, particularly a base material used for a circuit board, mechanical properties, and electric insulation; has high reliability as an insulating protective film; and can prevent generation of a crack of the protective film. Accordingly, the polymer, the photo-curable resin composition, and the photo-curable dry film of the present invention can be favorably used for a material for forming a film to protect various electric and electronic parts such as a circuit board, a semiconductor device, and a display device, as well as for forming a film for bonding substrates. The laminate produced by using the photo-curable resin composition or the photo-curable dry film of the present invention has excellent adhesion properties between the cured material layer and a substrate, and has high flatness.

DESCRIPTION OF EMBODIMENTS

The present inventors diligently study to accomplish the foregoing subjects and consequently found that a silicone skeleton-containing polymer shown by the following general formula (1), having a crosslinking group or a reactive point to generate crosslinking reaction in a molecule and a weight average molecular weight of 3,000 to 500,000, functions to give sufficient film formability. The inventors also found that the photo-curable resin layer obtained by the composition using the polymer can be formed into a film with a wide-ranging film thickness; is excellent in adhesion properties to a substrate, electric parts, and a semiconductor device; can give a cured material layer that has good pattern formability, excellent crack resistance, heat resistance, electric insulation, and reliability as an insulating protective film; and is excellent as a film to protect electric and electronic parts and a film for bonding substrates; thereby brought the present invention to completion.

Accordingly, the present invention provides a new silicone skeleton-containing polymer shown below, a photocurable resin composition, the photo-curable dry film thereof, laminate using these materials, and a patterning process.

Hereinafter, the silicone skeleton-containing polymer, the photo-curable resin composition, the photo-curable dry film thereof, laminate using these materials, and a patterning process of the present invention will be specifically described, but the present invention is not limited thereto.

Silicone Skeleton-Containing Polymer

The inventive silicone skeleton-containing polymer (the component (A) in the inventive photo-curable resin composition) is a silicone skeleton-containing polymer comprising a silicone skeleton shown by the following formula (1) and having a weight average molecular weight of 3,000 to 500,000,

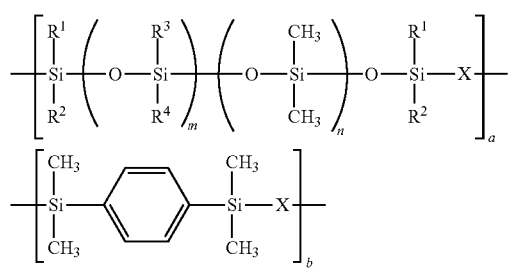

(1)

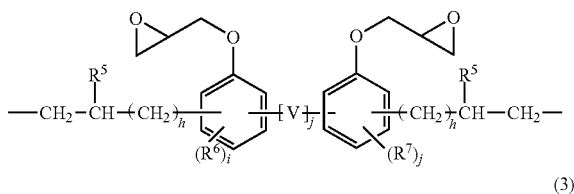

(2)

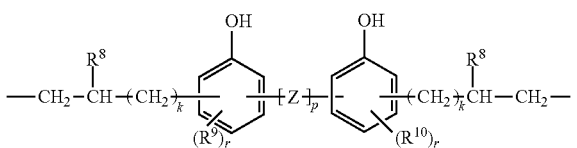

(3)

[wherein $R^1$ to $R^4$ each independently represent a monovalent hydrocarbon group having 1 to 8 carbon atoms; "m" and "n" are each independently an integer of 0 to 300; the both of "a" and "b" are positive numbers satisfying a+b=1; each of "X" independently represents a linking group selected from the divalent groups shown by the following general formulae (2), (3), (4), (5), and (6), and when the molar numbers of units shown by the following general formulae (2), (3), (4), (5), and (6) are defined as "c", "d", "e", "f", and "g" respectively, each of "c", "d", "e", and "g" is 0 or a positive number, and "f" is a positive number, with the proviso that c+d+e is a positive number, (wherein "V" and "Z" each independently represent a divalent organic group selected from the following

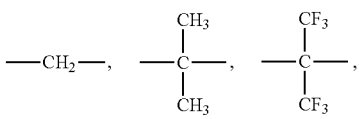

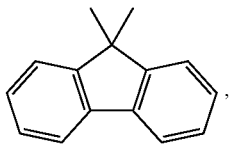

"j" and "p" are each independently 0 or 1, $R^5$ and $R^8$ each independently represents a hydrogen atom or a methyl group, "h" and "k" are each independently an integer of 0 to 7, $R^6$, $R^7$, $R^9$, and $R^{10}$ each independently represent the same or different group selected from alkyl groups and alkoxy groups having 1 to 4 carbon atoms, and "i" and "r" are each independently any of 0, 1, and 2);

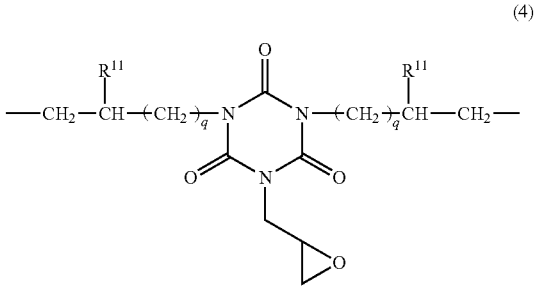

(4)

(wherein $R^{11}$ represents a hydrogen atom or a methyl group, and "q" is an integer of 0 to 7),

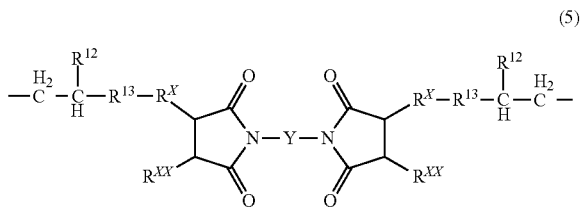

(5)

(wherein "Y" is a divalent organic group, each of $R^{12}$ independently represents the same or different moiety selected from a hydrogen atom, monovalent hydrocarbon groups having 1 to 8 carbon atoms, and monovalent hydrocarbon groups having 1 to 8 carbon atoms partly substituted with a halogen atom, each of $R^{13}$ independently represents the same or different alkylene group having 1 to 8 carbon atoms, $R^x$ is a single bond or a group to form a ring structure with $R^{xx}$ by ring closure, and $R^{xx}$ is a hydrogen atom or a monovalent hydrocarbon group having 1 to 8 carbon atoms),

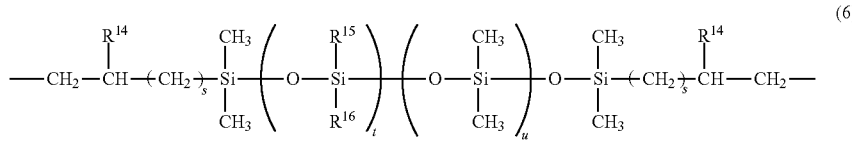

(wherein "t" and "u" are each independently an integer of 0 to 300, $R^{14}$ represents a hydrogen atom or a methyl group, $R^{15}$ and $R^{16}$ each independently represent a monovalent hydrocarbon group having 1 to 8 carbon atoms, and "s" is an integer of 0 to 7)].

This silicone skeleton-containing polymer of the present invention (component (A)) functions to give film formability. The obtained resin film gives good adhesion properties to a laminate, a substrate, etc., good pattern formability, crack resistance, and heat resistance. It is to be noted that the silicone skeleton-containing polymer shown by the foregoing general formula (1) has a crosslinking group or a reactive point to generate crosslinking reaction such as an epoxy group, hydroxy group, etc. in the molecule.

The inventive silicone skeleton-containing polymer is a polymer comprising repeating units shown by the foregoing formula (1) and having a weight average molecular weight of 3,000 to 500,000, preferably 5,000 to 200,000, which is measured by gel permeation chromatography (GPC) in terms of polystyrene with tetrahydrofuran eluent. In the formula (I), the both of "a" and "b" are positive numbers satisfying a+b=1. Preferably, $0.05 \leq a \leq 0.8$, particularly $0.1 \leq a \leq 0.7$, and more preferably $0.2 \leq b \leq 0.95$, particularly $0.3 \leq b \leq 0.9$. Each unit may be bound randomly or bound as a block copolymer. In the formula (1), the silicone (siloxane) content is preferably 30 to 80% by mass.

In the formula (1), "m" and "n" are each independently an integer of 0 to 300; "m" is preferably 0 to 200, particularly 0 to 100; and "n" is preferably 0 to 200, particularly 0 to 100. Each of "X" independently represents a linking group selected from the divalent groups shown by the foregoing formulae (2), (3), (4), (5), and (6); and when the molar numbers of units shown by the general formulae (2), (3), (4), (5), and (6) are defined as "c", "d", "e", "f", and "g" respectively, each of "c", "d", "e", and "g" is 0 or a positive number, and "f" is a positive number, with the proviso that c+d+e is a positive number.

In this case, these molar numbers are preferably such that $0 \geq c$/the molar number of the linking group shown by "X" contained in the silicone resin (A) (hereinafter, the molar number of "X")$\leq 0.6$, $0 \leq d$/the molar number of "X"$\leq 0.8$, $0 \leq e$/the molar number of "X"$\leq 0.6$, $0 < f$/the molar number of "X"$\leq 0.8$, and $0 \leq g$/the molar number of "X"$\leq 0.6$; more preferably, $0 < c$/the molar number of "X"$\leq 0.4$, $0 < d$/the molar number of "X"$\leq 0.7$, $0 < e$/the molar number of "X"$\leq 0.4$, $0.1 \leq f$/the molar number of "X"$\leq 0.6$, and $0 \leq g$/the molar number of "X"$\leq 0.4$. Provided that c+d+e+f+g/the molar number of "X"=1. It is to be noted that the foregoing linking groups may be bound in either formation of random bonding or block bonding.

Each of $R^1$ to $R^4$ independently represents a monovalent hydrocarbon group having 1 to 8 carbon atoms, preferably 1 to 6 carbon atoms. Illustrative examples thereof include alkyl groups, cycloalkyl groups, aryl groups; such as a methyl group, an ethyl group, a propyl group, a hexyl group, a cyclohexyl group, and a phenyl group. Among them, a methyl group and a phenyl group are preferable since they are easily available.

In the general formulae (2) and (3), $R^6$, $R^7$, $R^9$, and $R^{10}$ each independently represent an alkyl group or an alkoxy group having 1 to 4 carbon atoms, such as a methyl group, an ethyl group, a propyl group, a butyl group, a methoxy group, an ethoxy group, a propoxy group, and a butoxy group.

In the general formula (5), "Y" is a divalent organic group. Incidentally, in the present invention, "the divalent organic group" means a divalent group that contains a carbon atom. Illustrative examples of "Y" include the following organic groups.

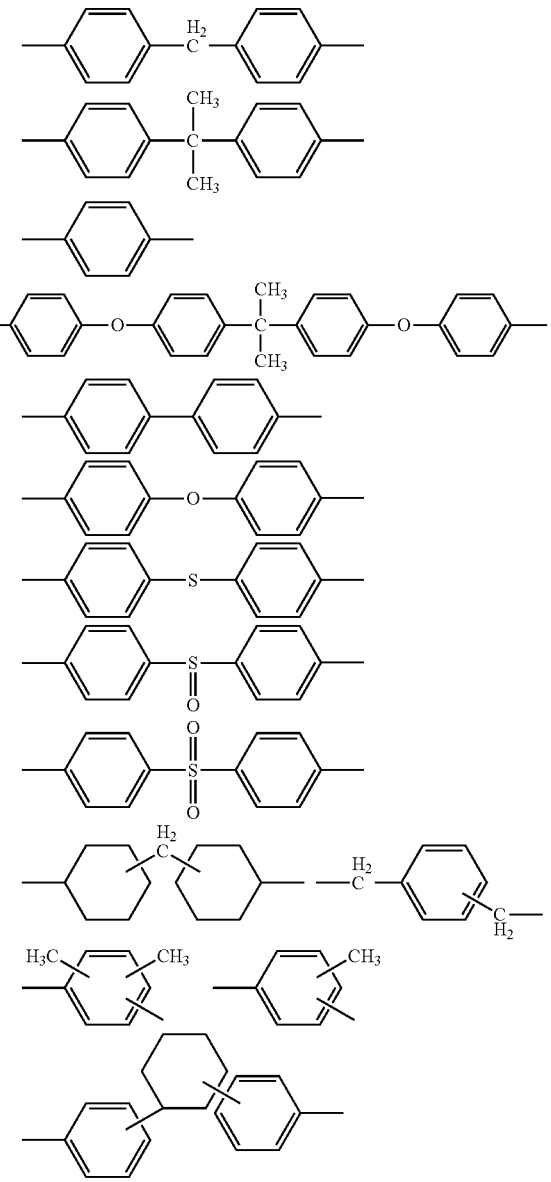

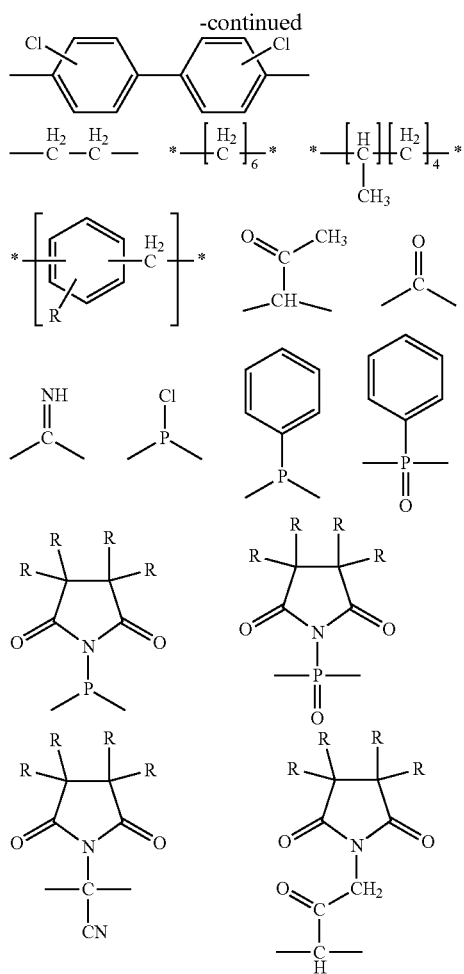
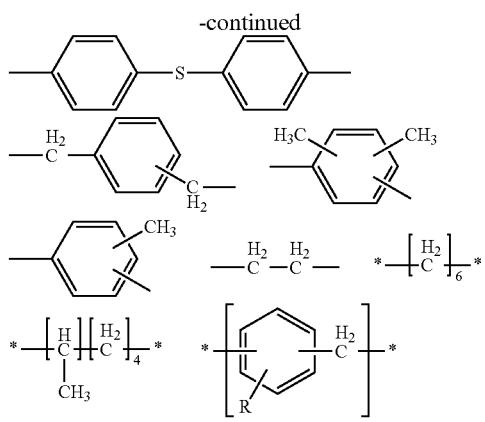

In the foregoing formulae, each "R" independently represents a hydrogen atom or a methyl group.

Among them, "Y" is preferably the one selected from the following organic groups.

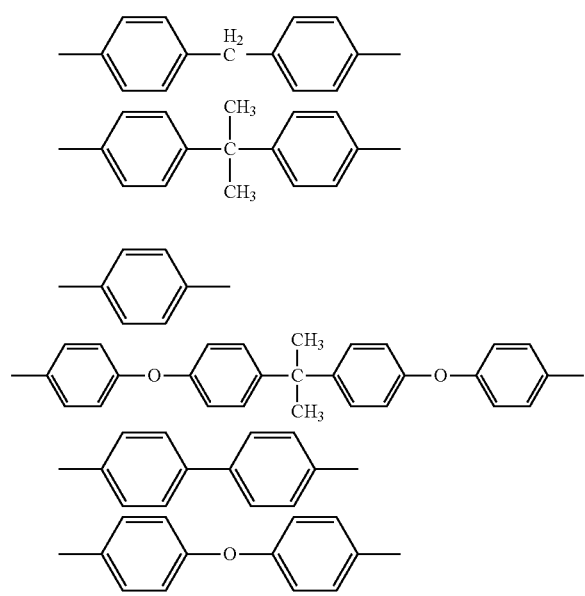

It is to be noted that the foregoing organic groups may be the ones in which a hydrogen atom in the skeleton is substituted with a halogen atom (fluorine, chlorine, bromine, and iodine).

Each of $R^{12}$ independently represents a hydrogen atom or a monovalent hydrocarbon group having 1 to 8 carbon atoms, and may be partly substituted with a halogen atom. Illustrative examples of this $R^{12}$ include the same monovalent hydrocarbon groups as illustrated as $R^1$ to $R^4$, and these groups partly substituted with a halogen atom (chlorine, bromine, fluorine, and iodine). Each of $R^{13}$ independently represents an alkylene group having 1 to 8 carbon atoms such as a methylene group, an ethylene group, a propylene group, and a butylene group.

In the general formula (5), $R^x$ is a single bond or a group to form a ring structure with $R^{xx}$ by ring closure, and $R^{xx}$ is a hydrogen atom or a monovalent hydrocarbon group having 1 to 8 carbon atoms. Illustrative examples of the ring structure obtained by ring closure of $R^x$ and $R^{xx}$ include the following. Incidentally, in each of the following formulae, the two bonds on the left side thereof bind to a nitrogen-containing five-membered ring in the formula (5) to form a ring structure.

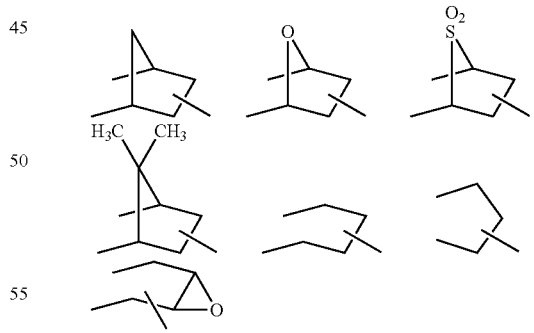

Among them, the following are preferably selected.

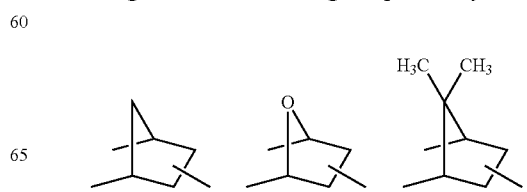

Particularly, it is preferable that the skeleton of the general formula (5) is that of the following formula (5-1);

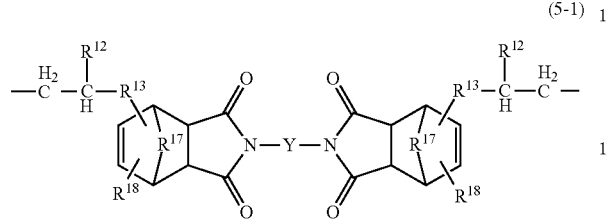

(5-1)

(wherein "Y", $R^{12}$, and $R^{13}$ are the same as above, each of $R^{17}$ independently represents the same or different alkylene group having 1 to 8 carbon atoms, and each of $R^{18}$ independently represents the same or different moiety selected from a hydrogen atom, monovalent hydrocarbon groups having 1 to 8 carbon atoms, and monovalent hydrocarbon groups having 1 to 8 carbon atoms partly substituted with a halogen atom).

The inventive silicone skeleton-containing polymer preferably contains a bisallylnadiimide skeleton bound in the molecule or at the terminal as a terminal group.

In the general formula (6), $R^{15}$ and $R^{16}$ each independently represent a monovalent hydrocarbon group having 1 to 8 carbon atoms, and illustrative examples thereof include the same monovalent hydrocarbon groups as illustrated as $R^1$ to $R^4$; "t" and "u" are each independently an integer of 0 to 300, and preferably, "t" is 0 to 200, particularly 0 to 100, "u" is 0 to 200, particularly 0 to 100; $R^{14}$ represents a hydrogen atom or a methyl group; and "s" is an integer of 0 to 7.

[Production Method of Silicone Skeleton-Containing Polymer]

The inventive silicone skeleton-containing polymer can be produced by addition polymerization under a metal catalyst by using compounds selected from the compounds shown by the following general formula (7), the following general formula (8), the following general formula (9), the following general formula (10), the following general formula (11), the following general formula (12), and the following general formula (13).

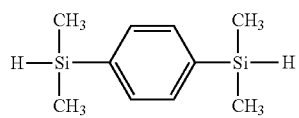

(7)

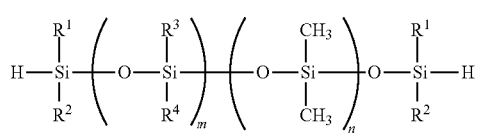

(8)

(In these formulae, $R^1$ to $R^4$ each independently represent a monovalent hydrocarbon group having 1 to 8 carbon atoms; "m" and "n" are each independently an integer of 0 to 300).

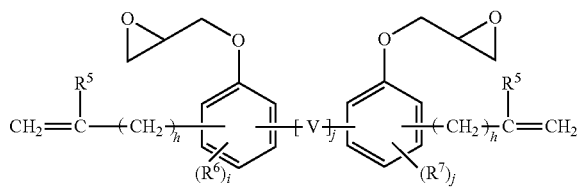

(9)

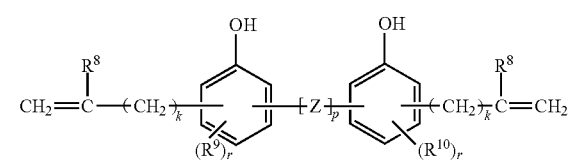

(10)

(In these formulae, "V" and "Z" each independently represent a divalent organic group selected from the following

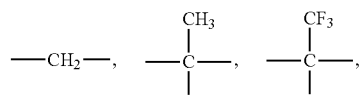

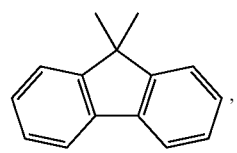

"j" and "p" are each independently 0 or 1, $R^5$ and $R^8$ each independently represents a hydrogen atom or a methyl group, "h" and "k" are each independently an integer of 0 to 7, $R^6$, $R^7$, $R^9$, and $R^{10}$ each independently represent the same or different group selected from alkyl groups and alkoxy groups having 1 to 4 carbon atoms, and "i" and "r" are each independently any of 0, 1, and 2).

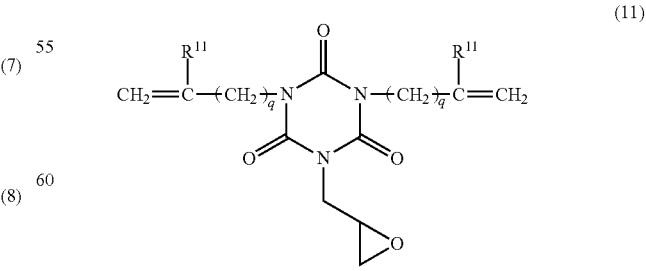

(11)

(In this formula, RH represents a hydrogen atom or a methyl group, and "q" is an integer of 0 to 7).

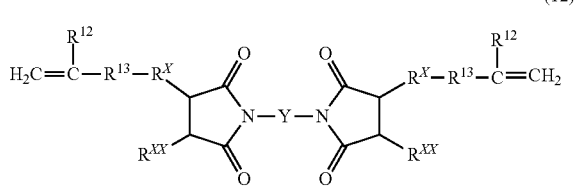

(12)

(In this formula, "Y" is a divalent organic group, each of $R^{12}$ independently represents the same or different moiety selected from a hydrogen atom, monovalent hydrocarbon groups having 1 to 8 carbon atoms, and monovalent hydrocarbon groups having 1 to 8 carbon atoms partly substituted with a halogen atom, each of $R^{13}$ independently represents the same or different alkylene group having 1 to 8 carbon atoms, $R^x$ is a single bond or a group to form a ring structure with $R^{xx}$ by ring closure, and $R^{xx}$ is a hydrogen atom or a monovalent hydrocarbon group having 1 to 8 carbon atoms).

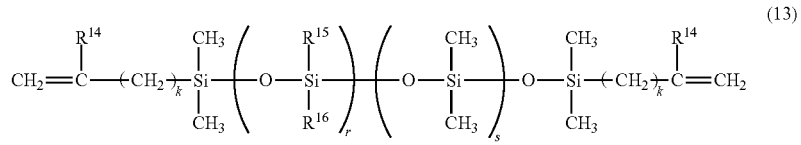

(13)

(In this formula, "t" and "u" are each independently an integer of 0 to 300, $R^{14}$ represents a hydrogen atom or a methyl group, $R^{15}$ and $R^{16}$ each independently represent a monovalent hydrocarbon group having 1 to 8 carbon atoms, and "s" is an integer of 0 to 7).

The metal catalyst that can be used include a platinum group metal simple substance such as platinum (including platinum black), rhodium, and palladium; platinum chloride, a chloroplatinic acid, and chloroplatinate such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$, and $Na_2HPtCl_4 \cdot xH_2O$ (in the formula, "x" is preferably an integer of 0 to 6, particularly 0 or 6); an alcohol-modified chloroplatinic acid (e.g., described in U.S. Pat. No. 3,220,972); a complex of a chloroplatinic acid and olefin (e.g., described in U.S. Pat. Nos. 3,159,601, 3,159,662, and 3,775,452); a material obtained by supporting a platinum group metal such as platinum black and palladium on a carrier such as alumina, silica, or carbon; a rhodium-olefin complex; chlorotris(triphenylphosphine) rhodium (a so-called Wilkinson's catalyst); and a complex of platinum chloride, a chloroplatinic acid, or chloroplatinate and vinyl group-containing siloxane (vinyl group-containing cyclic siloxane in particular).

The amount of the catalyst may be a catalytic amount, and preferably 0.001 to 0.1% by mass of the platinum group metal based on a total amount of the reacted polymer. In the polymerization reaction, solvent may be used in accordance with needs. As the solvent, hydrocarbon solvents such as toluene and xylene are preferable. As the conditions of the polymerization, the polymerization temperature is preferably 40 to 150° C., particularly 60 to 120° C., for example, since the polymerization can be completed in a short time without inactivating the catalyst. The reaction time may be appropriately selected in accordance with the type and amount of the polymer, and is preferably about 0.5 to 100 hours, particularly 0.5 to 30 hours in order to prevent intervention of humidity to the reaction system. After finishing the polymerization reaction as described above, the solvent is removed by evaporation when it was used, and the inventive silicone skeleton-containing polymer (silicone resin) shown by the formula (1) can be obtained.

The reaction method is not particularly limited. For example, when reacting a compound shown by formula (7), a compound shown by formula (8), a compound shown by formula (9), a compound shown by formula (10), and a compound shown by formula (12), it is preferable to adopt a method in which the compounds shown by formula (9), formula (10), and formula (12) are mixed and warmed at first, and then a metal catalyst is added to the mixture, and subsequently, compounds shown by formula (7) and formula (8) are added dropwise over 0.1 to 5 hours.

Each compound is preferably formulated in such a ratio that the total molar amount of hydrosilyl groups contained in the compounds shown by the formula (7) and the formula (8) based on the total molar amount of alkenyl groups contained in the compounds shown by the formula (9), the formula (10), formula (11), formula (12), and formula (13) is 0.67 to 1.67, particularly 0.83 to 1.25. The weight average molecular weight of the polymer can be controlled by using a monoallyl compound such as o-allylphenol, monohydrosilane such as triethylhydrosilane, or monohydrosiloxane as a molecular weight modifier.

Photo-curable Resin Composition

The inventive photo-curable resin composition is a composition comprising the foregoing silicone skeleton-containing polymer (A), and a photo-acid generator (B) that is decomposed by light having a wavelength of 190 to 500 nm to generate an acid. Such a photo-curable resin composition can form a film with a wide-ranging film thickness, and can form a fine pattern with excellent vertical by the patterning process that will be described below. The cured film obtained by the patterning process using such a photo-curable resin composition and the dry film thereof can be a film that is excellent in patterning characteristics, heat resistance, electric insulation, reliability as an insulating protective film, and adhesion properties to a substrate and so on in particular.

[Photo-Acid Generator (B)]

The photo-acid generator (B) include a compound that is irradiated with light having a wavelength of 190 to 500 nm to generate an acid, which becomes a curing catalyst. The inventive resin composition has excellent compatibility with photo-acid generators, so that various photo-acid generators can be used. Illustrative examples of such a photo-acid generator include an onium salt, a diazomethane derivative, a glyoxime derivative, a β-ketosulfone derivative, a disulfone derivative, a nitrobenzylsulfonate derivative, a sulfonate ester derivative, an imide-yl-sulfonate derivative, an oximesulfonate derivative, an iminosulfonate derivative, and a triazine derivative.

The onium salt may be exemplified by a compound shown by the following general formula (14), $$(R^{19})_v M^+ K^- \qquad (14)$$

(wherein $R^{19}$ represents a linear, branched, or cyclic alkyl group having 1 to 12 carbon atoms, an aryl group having 6 to 12 carbon atoms, or an aralkyl group having 7 to 12 carbon atoms, which may have substituent; $M^+$ represents an iodonium or an sulfonium; and $K^-$ represents a non-nucleophilic counter ion; and "v" is 2 or 3).

In the foregoing $R^{19}$, illustrative examples of the alkyl group which may have substituent include a methyl group, an ethyl group, a propyl group, a butyl group, a cyclohexyl group, a 2-oxocyclohexyl group, a norbornyl group, and an adamantyl group. Illustrative examples of the aryl group which may have substituent include a phenyl group; alkoxy phenyl groups such as an o-, m-, or p-methoxyphenyl group, an o-, m-, or p-ethoxyphenyl group, and a m- or p-tert-butoxyphenyl group; and alkyl phenyl groups such as a 2-, 3-, or 4-methylphenyl group, a 2-, 3-, or 4-ethylphenyl group, a 4-tert-butylphenyl group, a 4-butylphenyl group, and a dimethylphenyl group.

Illustrative examples of the aralkyl group which may have substituent include a benzyl group and a phenethyl group.

Illustrative examples of the non-nucleophilic counter ion $K^-$ include halide ions such as a chloride ion and a bromide ion; fluoroalkyl sulfonates such as triflate, 1,1,1-trifluoroethane sulfonate, and nonafluorobutane sulfonate; aryl sulfonates such as tosylate, benzenesulfonate, 4-fluorobenzenesulfonate, and 1,2,3,4,5-pentafluorobenzenesulfonate; and alkyl sulfonates such as mesylate and butanesulfonate.

The diazomethane derivative may be exemplified by a compound shown by the following general formula (15),

(15)

(wherein $R^{20}$ represents the same or different group selected from linear, branched, and cyclic alkyl groups and halogenated alkyl groups having 1 to 12 carbon atoms, aryl groups optionally having substituents and halogenated aryl groups having 6 to 12 carbon atoms, and aralkyl groups having 7 to 12 carbon atoms).

In the foregoing $R^{20}$, illustrative examples of the alkyl group include a methyl group, an ethyl group, a propyl group, a butyl group, an amyl group, a cyclopentyl group, a cyclohexyl group, a norbornyl group, and an admantyl group. Illustrative examples of the halogenated alkyl group include a trifluoromethyl group, a 1,1,1-trifluoroethyl group, a 1,1,1-trichloroethyl group, and a nonafluorobutyl group.

Illustrative examples of the aryl group optionally having substituents include a phenyl group; alkoxyphenyl groups such as an o-, m-, or p-methoxyphenyl group, an o-, m-, or p-ethoxyphenyl group, and a m- or p-tert-butoxyphenyl group; and alkylphenyl groups such as a 2-, 3-, or 4-methylphenyl group, a 2-, 3-, or 4-ethylphenyl group, a 4-tert-butylphenyl group, a 4-butylphenyl group, and a dimethylphenyl group. Illustrative examples of the halogenated aryl group include a fluorophenyl group, a chlorophenyl group, and a 1,2,3,4,5-pentafluorophenyl group. Illustrative examples of the aralkyl group include a benzyl group and a phenethyl group.

Specific examples of the photo-acid generator include onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluolobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl) iodonium hexafluorophosphate, and diphenyl(4-thiophenoxyphenyl)sulfonium hexafluoroantimonate; diazomethane derivatives such as bis(benzenesulfonyl) diazomethane, bis(p-toluenesulfonyl) diazomethane, bis(xylenesulfonyl) diazomethane, bis(cyclohexylsulfonyl) diazomethane, bis(cyclopentylsulfonyl) diazomethane, bis(n-butylsulfonyl) diazomethane, bis(isobutylsulfonyl) diazomethane, bis(sec-butylsulfonyl) diazomethane, bis(n-propylsulfonyl) diazomethane, bis(isopropylsulfonyl) diazomethane, bis(tert-butylsulfonyl) diazomethane, bis(n-amylsulfonyl) diazomethane, bis(isoamylsulfonyl) diazomethane, bis(sec-amylsulfonyl) diazomethane, bis(tert-amylsulfonyl) diazomethane, 1-cyclohexylsulfonyl-1-(tert-butylsulfonyl) diazomethane, 1-cyclohexylsulfonyl-1-(tert-amylsulfonyl) diazomethane, and 1-tert-amylsulfonyl-1-(tert-butylsulfonyl) diazomethane; glyoxime derivatives such as bis-o-(p-toluenesulfonyl)-α-dimethyl glyoxime, bis-o-(p-toluenesulfonyl)-α-diphenyl glyoxime, bis-o-(p-toluenesulfonyl)-α-dicyclohexyl glyoxime, bis-o-(p-toluenesulfonyl)-2,3-pentanedione glyoxime, bis-(p-toluenesulfonyl)-2-methyl-3,4-pentanedione glyoxime, bis-o-(n-butanesulfonyl)-α-dimethyl glyoxime, bis-o-(n-butanesulfonyl)-α-diphenyl glyoxime, bis-o-(n-butanesulfonyl)-α-dicyclohexyl glyoxime, bis-o-(n-butanesulfonyl)-2,3-pentanedione glyoxime, bis-o-(n-butanesulfonyl)-2-methyl-3,4-pentanedione glyoxime, bis-o-(methanesulfonyl)-α-dimethyl glyoxime, bis-o-(trifluoromethanesulfonyl)-α-dimethyl glyoxime, bis-o-(1,1,1-trifluoroethanesulfonyl)-α-dimethyl glyoxime, bis-o-(tert-butanesulfonyl)-α-dimethyl glyoxime, bis-o-(perfluorooctanesulfonyl)-α-dimethyl glyoxime, bis-o-(cyclohexanesulfonyl)-α-dimethyl glyoxime, bis-o-(benzenesulfonyl)-α-dimethyl glyoxime, bis-o-(p-fluorobenzenesulfonyl)-α-dimethyl glyoxime, bis-o-(p-tert-butylbenzenesulfonyl)-α-dimethyl glyoxime, bis-o-(xylenesulfonyl)-α-dimethyl glyoxime, and bis-o-(camphersulfonyl)-α-dimethyl glyoxime; oxime sulfonate derivatives such as α-(benzenesulfoniumoxyimino)-4-methylphenylacetonitrile; β-keto sulfone derivatives such as 2-cyclohexylcarbonyl-2-(p-toluenesulfonyl) propane and 2-isopropylcarbonyl-2-(p-toluenesulfonyl) propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; imide-yl-sulfonate derivatives such as phthalimide-yl-triflate, phthalimide-yl-tosylate, 5-norbornene 2,3-dicarboxyimide-yl-triflate, 5-norbornene 2,3- dicarboxyimide-yl-tosylate, 5-norbornene 2,3-dicarboxyimide-yl-n-butylsulfonate, and n-trifluoromethylsulfonyloxy naphthylimide.

Illustrative examples thereof further include iminosulfonates such as (5-(4-methylphenyl)sulfonyloxyimino-5H-thiophene-2-ylidene)-(2-methylphenyl)acetonitrile and (5-(4-(4-methylphenylsulfonyloxy)phenylsulfonyloxyimino)-5H-thiophene-2-ylidene)-(2-methylphenyl)acetonitrile; and 2-methyl-2[(4-methylphenyl)sulfonyl]-1-[(4-methylthio) phenyl]-1-propane. Among them, imide-yl-sulfonates, iminosulfonates, and oximesulfonates are preferably used.

The formulation amount of the photo-acid generator (B) is preferably 0.05 to 20 parts by mass, particularly 0.05 to 5 parts by mass based on 100 parts by mass of the silicone skeleton-containing polymer (A) in view of photo-curability. When the amount of the photo-acid generator (B) is 0.05 parts by mass or more, there arises no risk of insufficient crosslinking reaction due to a shortage of the generation amount of the acid. When the amount is 20 parts by mass or less, it is possible to suppress an increase of the absorbance of the acid generator itself and to avoid the risk of lowering the transparency.

[Crosslinking Agent (C)]

The inventive photo-curable resin composition preferably contains a crosslinking agent (C). The component (C) used in the present invention is a component that proceeds condensation reaction with the foregoing phenol group or the aikoky group of $R^9$ and/or $R^{10}$ in the formula (3) of the component (A) to make the patterning easy, and further enhances the strength of the cured material. As such a component (C), a resin with a weight average molecular weight of 150 to 10,000, particularly 200 to 3,000 are preferred. When the weight average molecular weight is 150 or more, sufficient photo-curability can be obtained; and when it is 10,000 or less, the heat resistance of the cured composition cannot be degraded.

It is also preferable that the crosslinking agent (C) be any one or more species selected from amino condensates modified with formaldehyde or formaldehyde-alcohol, phenol compounds having on average two or more methylol groups or alkoxy methylol groups in a molecule thereof, and epoxy compounds having on average two or more epoxy groups in a molecule thereof.

The amino condensate modified with formaldehyde or formaldehyde-alcohol of the component (C) may be exemplified by melamine condensates modified with formaldehyde or formaldehyde-alcohol and urea condensates modified with formaldehyde or formaldehyde-alcohol.

To synthesize the modified melamine condensate, for example, a melamine monomer is modified with formaldehyde into a methylol form, and optionally, the resultant compound is further modified with an alcohol into an alkoxy form according to a known method, thereby obtaining the modified melamine shown by the following general formula (16). In this case, lower alcohols such as an alcohol having 1 to 4 carbon atoms are preferred as the alcohol.

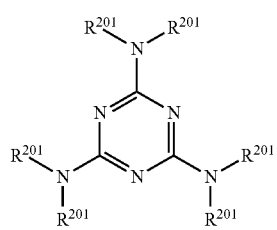

(16)

(In this formula, each $R^{201}$ may be the same or different, and represents a methylol group, an alkoxymethyl group containing an alkoxy group having 1 to 4 carbon atoms, or a hydrogen atom, provided that one or more of them is a methylol group or the foregoing alkoxymethyl group).

Examples of $R^{201}$ include a methylol group, alkoxymethyl groups such as a methoxymethyl group and an ethoxymethyl group, and a hydrogen atom. Specific examples of the modified melamine shown by the formula (16) include trimethoxymethyl monomethylol melamine, dimethoxymethyl monomethylol melamine, trimethylol melamine, hexamethylol melamine, and hexamethoxymethylol melamine.

Then, the modified melamine shown by the general formula (16) or the multimeric compound thereof (e.g. oligomer including dimer and trimer) is polymerized by addition condensation with formaldehyde according to a known method until a desired molecular weight is obtained, thereby obtaining the melamine condensate modified with formaldehyde or formaldehyde-alcohol of the component (C). It is to be noted that one or more kinds of the modified melamine condensates of a monomer shown by the general formula (16) and the multimeric compound thereof can be used as the component (C).

Also, an urea condensate modified with formaldehyde or formaldehyde-alcohol can be synthesized by modifying an urea condensate having a desired molecular weight with formaldehyde into a methylol form, and optionally, further modifying the resultant compound with an alcohol into an alkoxy form, according to a known method.

Illustrative examples of the modified urea condensate include a methoxymethylated urea condensate, an ethoxymethylated urea condensate, and a propoxymethylated urea condensate. It is to be noted that one or more kinds of these modified urea condensates can be used as the component (C).

The phenol compound having on average two or more methylol groups or alkoxymethylol groups per molecule of the component (C) may be exemplified by (2-hydroxy-5-methyl)-1,3-benzenedimethanol, 2,2',6,6'-tetramethoxymethyl bisphenol A, and the like.

The epoxy compound having on average two or more epoxy groups per molecule of the component (C) may be exemplified by bisphenol-type epoxy resins such as bisphenyl A type epoxy resin and bisphenol F type epoxy resin; novolak-type epoxy resins such as phenol novolak type epoxy resin and cresol novolak type epoxy resin; triphenolalkane type epoxy resins and their polymerizates; biphenyltype epoxy resins; dicyclopentadiene-modified phenol novolak type epoxy resins; phenolaralkyl-type epoxy resins; biphenylaralkyl-type epoxy resins; naphthalene ring-containing epoxy resins; glycidyl ester type epoxy resins; alicyclic epoxy resins; and heterocyclic epoxy resins.

These amino condensates, phenol compounds, and epoxy compounds of the component (C) can be used solely or as a mixture of two or more kinds.

The amount of the amino condensate, phenol compound, and epoxy compound of the component (C) is preferably in the range of 0.5 to 50 parts by mass, particularly 1 to 30 parts by mass based on 100 parts by mass of the silicone skeleton-containing polymer of the component (A). The amount of 0.5 parts by mass or more can give sufficient curability in light irradiation, and the amount of 50 parts by mass or less does not lower the ratio of the silicone skeleton-containing polymer in the photo-curable resin composition, and enables the cured material to achieve the sufficient effect of the present invention.

[Solvent (D)]

The inventive photo-curable resin composition can also contain solvent (D). It is possible to select and blend any solvent that can dissolve the foregoing silicone skeleton-containing polymer (A), the photo-acid generator (B), and the crosslinking agent (C), as well as the basic compound (E) and the other various additives that will be described below. In solubility of these components, however, organic solvent is particularly preferable.

Illustrative examples of the organic solvent include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; and these may be used one or more kinds. Among them, ethyl lactate, cyclohexanone, cyclopentanone, propylene glycol monomethyl ether acetate, and γ-butyrolactone, or a mixture of them are particularly preferred, because these materials have the utmost solubility to the photo-acid generator.

In view of compatibility and viscosity of the photo-curable resin composition, the amount of the solvent to be blended is preferably in the range of 50 to 2,000 parts by mass, more preferably 50 to 1,000 parts by mass, particularly 50 to 100 parts by mass based on 100 parts by mass of the total amount of the silicone skeleton-containing polymer (A) and the photo-acid generator (B).

[Basic Compound (E)]

The inventive photo-curable resin composition can also contain a basic compound (E). As the basic compound (E), a compound, which is capable of suppressing diffusion rate of an acid that is generated from the photo-acid generator in the photo-curable resin layer, is suitable. By blending the basic compound like this, the resolution can be enhanced, the sensitivity change after exposure can be suppressed, and dependence on a substrate and an environment can be made small, so that the exposure latitude, the pattern shape, and the like may be improved.

Illustrative examples of the basic compound include primary, secondary, and tertiary aliphatic amines, mixed amines, aromatic amines, heterocyclic amines, a nitrogen-containing compound having a carboxy group, a nitrogen-containing compound having a sulfonyl group, a nitrogen-containing compound having a hydroxy group, a nitrogen-containing compound having a hydroxyphenyl group, a nitrogen-containing alcoholic compound, an amide derivative, and an imide derivative.

Illustrative examples of the primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Illustrative examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylene diamine, N,N-dimethylethylene diamine, and N,N-dimethyltetraethylene pentamine.

Illustrative examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylene diamine, tetramethylethylene diamine, and N,N,N',N'-tetxamethyltetraethylene pentamine.

Illustrative examples of the mixed amines include dimethylethylamine, methylethylpropylamine, benzylamine, phenethylamine, and benzyldimethylamine.

Illustrative examples of the aromatic amines and the heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pirazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Illustrative examples of the nitrogen-containing compound having a carboxy group include amino benzoic acid, indole carboxylic acid, and amino acid derivatives (e.g., nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxy alanine).

Illustrative examples of the nitrogen-containing compound having a sulfonyl group include 3-pyridinesulfonic acid and pyridinium p-toluenesulfonate.

Illustrative examples of the nitrogen-containing compound having a hydroxy group, the nitrogen-containing compound having a hydroxyphenyl group, and the nitrogen-containing alcoholic compound include 2-hydroxy pyridine, amino cresol, 2,4-quinoline diol, 3-indole methanol hydrate, monoethanol amine, diethanol amine, triethanol amine, N-ethyl diethanol amine, N,N-diethyl ethanol amine, triisopropanol amine, 2,2'-imino diethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane dial, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotine amide.

Illustrative examples of the amide derivative include formamide, N-methyl formamide, N,N-dimethyl formamide, acetamide, N-methyl acetamide, N,N-dimethyl acetamide, propione amide, and benzamide.

Illustrative examples of the imide derivative include phthalimide, succinimide, and maleimide.

It is also possible to add one or more compounds selected from the basic compounds shown by the following general formula (17).

$$N(\alpha)_w(\beta)_{3-w} \quad (17)$$

(In the general formula (17), "w" is 1, 2, or 3. The side chain α may be the same or different and represents a substituent shown by any of the following general formulae (18) to (20). The side chain β may be the same or different and represents a hydrogen atom, or a linear, branched, or cyclic alkyl group having 1 to 20 carbon atoms and optionally containing an ether bond or a hydroxy group. Further, the side chains α may be bonded with each other to form a ring).

(18)

(19)

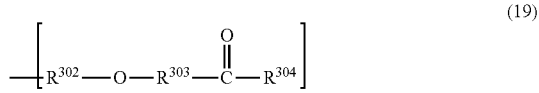
(20)

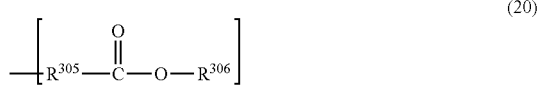

In the foregoing formulae, $R^{300}$, $R^{302}$, and $R^{305}$ represent a linear or branched alkylene group having 1 to 4 carbon atoms; and $R^{301}$ and $R^{304}$ represent a hydrogen atom or a linear, branched, or cyclic alkyl group having 1 to 20 carbon atoms and optionally containing one or more of a hydroxy group, an ether bond, an ester bond, and a lactone ring. $R^{303}$ represents a single bond, or a linear or branched alkylene group having 1 to 4 carbon atoms; and $R^{306}$ represents a linear, branched, or cyclic alkyl group having 1 to 20 carbon atoms and optionally containing one or more of a hydroxy group, an ether bond, an ester bond, and a lactone ring.

Illustrative examples of the compound shown by the general formula (17) include tris[2-(methoxymethoxy)ethyl] amine, tris[2-(2-methoxyethoxy)ethyl] amine, tris[2-(2-methoxyethoxymethoxy)ethyl] amine, tris[2-(1-methoxyethoxy)ethyl] amine, tris[2-(1-ethoxyethoxy) ethyl] amine, tris[2-(1-ethoxypropoxy) ethyl] amine, tris[2-{2-(2-hydroxyethoxy)ethoxy}ethyl] amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl) amine, tris(2-acetoxyethyl) amine, tris(2-propionyloxyethyl) amine, tris(2-butyryloxyethyl) amine, tris(2-isobutyryloxyethyl) amine, tris(2-valeryloxyethyl) amine, tris(2-pivaloyloxyethyl) amine, N,N-bis(2-acetoxyethyl) 2-(acetoxyacetoxy)ethyl amine, tris(2-methoxycarbonyloxyethyl) amine, tris(2-tert-butoxycarbonyloxyethyl) amine, tris[2-(2-oxopropoxy)ethyl] amine, tris[2-(methoxycarbonylmethyl)oxyethyl] amine, tris[2-(tert-butoxycarbonylmethyloxy)ethyl] amine, tris[2-(cyclohexyloxycarbonylmethyloxy)ethyl] amine, tris(2-methoxycarbonylethyl) amine, tris(2-ethoxycarbonylethyl) amine, N,N-bis(2-hydroxyethyl) 2-(methoxycarbonyl)ethyl amine, N,N-bis(2-acetoxyethyl) 2-(methoxycarbonyl)ethyl amine, N,N-bis(2-hydroxyethyl) 2-(ethoxycarbonyl)ethyl amine, N,N-bis(2-acetoxyethyl) 2-(ethoxycarbonyl)ethyl amine, N,N-bis(2-hydroxyethyl) 2-(2-methoxyethoxycarbonyl)ethyl amine, N,N-bis(2-acetoxyethyl) 2-(2-methoxyethoxycarbonyl)ethyl amine, N,N-bis(2-hydroxyethyl) 2-(2-hydroxyethoxycarbonyl)ethyl amine, N,N-bis(2-acetoxyethyl) 2-(2-acetoxyethoxycarbonyl)ethyl amine, N,N-bis(2-hydroxyethyl) 2-[(methoxycarbonyl)methoxycarbonyl]ethyl amine, N,N-bis(2-acetoxyethyi) 2-[(methoxycarbonyl)methoxycarbonyl]ethyl amine, N,N-bis(2-hydroxyethyl) 2-(2-oxopropoxycarbonyl)ethyl amine, N,N-bis(2-acetoxyethyl) 2-(2-oxopropoxycarbonyl) ethyl amine, N,N-bis(2-hydroxyethyl) 2-(tetrahydrofurfuryloxycarbonyl)ethyl amine, N,N-bis(2-acetoxyethyl) 2-(tetrahydrofurfuryloxycarbonyl)ethyl amine, N,N-bis(2-hydroxyethyl) 2-[(2-oxotetrahydrofuran-3-yl)oxycarbonyl]ethyl amine, N,N-bis(2-acetoxyethyl) 2-[(2-oxotetrahydrofuran-3-yl)oxycarbonyl] ethyl amine, N,N-bis (2-hydroxyethyl) 2-(4-hydroxybutoxycarbonyl)ethyl amine, N,N-bis(2-formyloxyethyl) 2-(4-formyloxybutoxycarbonyl) ethyl amine, N,N-bis(2-formyloxyethyl) 2-(2-formyloxyethoxycarbonyl)ethyl amine, N,N-bis(2-methoxyethyl) 2-(methoxycarbonyl)ethyl amine, N-(2-hydroxyethyl) bis [2-(methoxycarbonyl)ethyl] amine, N-(2-acetoxyethyl) bis [2-(methoxycarbonyl)ethyl] amine, N-(2-hydroxyethyl) bis [2-(ethoxycarbonyl)ethyl] amine, N-(2-acetoxyethyl) bis[2-(ethoxycarbonyl)ethyl] amine, N-(3-hydroxy-1-propyl) bis [2-(methoxycarbonyl)ethyl] amine, N-(3-acetoxy-1-propyl) bis[2-(methoxycarbonyl)ethyl] amine, N-(2-methoxyethyl) bis[2-(methoxycarbonyl)ethyl] amine, N-butyl bis[2-(methoxycarbonyl)ethyl] amine, N-butyl bis[2-(2-methoxyethoxycarbonyl) ethyl] amine, N-methyl bis(2-acetoxyethyl) amine, N-ethyl bis(2-acetoxyethyl) amine, N-methyl bis(2-pivaloyloxyethyl) amine, N-ethyl bis[2-(methoxycarbonyloxy)ethyl] amine, N-ethyl bis[2-(tert-butoxycarbonyloxy) ethyl] amine, tris(methoxycarbonylmethyl) amine, tris (ethoxycarbonylmethyl) amine, N-butyl bis (methoxycarbonylmethyl) amine, N-hexyl bis (methoxycarbonylmethyl) amine, and β-(diethylamino)-δ-valerolactone; however, the compound is not restricted to them.

The above-mentioned basic compounds may be used solely or as a mixture of two or more kinds. In view of sensitivity, the formulation amount of the basic compound is preferably in the range of 0 to 3 parts by mass, particularly preferably 0.01 to 1 part by mass, based on 100 parts by mass of the silicone skeleton-containing polymer of the component (A).

[Other Additives]

In addition to each of the foregoing components, other additives may be added to the inventive photo-curable resin composition. The additives may be exemplified by a surfactant which is commonly used to enhance coating properties.

As the surfactant, nonionic type surfactants such as fluorinated surfactants are preferred, and illustrative examples thereof include perfluoroalkyl polyoxyethylene ethanol, fluorinated alkyl ester, perfluoroalkylamine oxide, and fluorine-containing organosiloxane compounds. These surfactants may be commercially available products, and illustrative examples thereof include Flolade "FC-430" (product of Sumitomo 3M Ltd.), Surflon "S-141" and "S-145" (both are product of Asahi Glass Co., Ltd.), Unidyne "DS-401", "DS-4031", and "DS-451" (all are product of Daikin Industries, Ltd.), Megafac "F-8151" (product of DIC Co.), and "X-70-093" (product of Shin-Etsu Chemical Co., Ltd.). Among them, Flolade "FC-430" (product of Sumitomo 3M Ltd.) and "X-70-093" (product of Shin-Etsu Chemical Co., Ltd.) are preferred.

As the other additives, a silane coupling agent can also be added. The addition of a silane coupling agent can further enhance the adhesion properties of the resin composition to an adherend. The silane coupling agent may be exemplified by an epoxy silane coupling agent, an aromatic group-containing amino silane coupling agent, etc. They may be used alone, or in combination of two or more kinds. The content of the silane coupling agent is not particularly limited, but preferably 0.01% by mass or more and 5% by mass or less of the total amount of the inventive photo-curable resin composition, when it is formulated.

The inventive photo-curable resin composition may be prepared by a usual method. By mixing the foregoing components, and then filtering through a filter or the like to remove solids in accordance with need, the inventive photo-curable resin composition can be prepared.

Thus prepared photo-curable resin composition of the present invention can be favorably used as a material for a protective film of a semiconductor device, a protective film of wiring, a cover lay film, a solder mask, and an insulator film for through-silicon via (TSV), as well as an adhesive between substrates to be laminated in a three-dimensional lamination.

Patterning Process by using Photo-curable Resin Composition

Then, the inventive patterning process by using the inventive photo-curable resin composition will be described. The inventive patterning process is a patterning process comprising:

(i) a step of applying the inventive photo-curable resin composition onto a substrate to form a photo-curable resin layer on the substrate, (ii) a step of exposing the photo-curable resin layer via a photomask, and (iii) a step of development by using a developer after heat treatment subsequent to the exposing, thereby dissolving and removing an unexposed portion to form a pattern.

It is also possible to include (iv) a step of subjecting a film patterned by the development to post-cure at a temperature of 100 to 250° C. Through these steps, it is possible to obtain a film such as a film to protect electric and electronic parts, which is a final purpose.

In the patterning process by using the photo-curable resin composition, (i) the photo-curable resin composition is applied onto a substrate at first to form a photo-curable resin layer. The foregoing substrate may be exemplified by a silicon wafer, a silicon wafer for a through-silicon via, a silicon wafer thinned by back-side polishing, a substrate made of plastics or ceramics, and a substrate with the surface entirely or partly having a metal such as Ni and Au by an ion sputtering method or a plating method. The substrate having either or both of a trench and a hole with an aperture width of 10 to 100 µm and a depth of 10 to 120 µm can be used.

As the application method, known lithography technology can be adopted. For example, the inventive photo-curable resin composition can be applied by a dipping method, a spin coating method, and a roll coating method. The amount of coating can be appropriately selected in accordance with the purpose, but can be an amount to form a photo-curable resin layer with a film thickness of 0.1 to 200 µm, preferably 1 to 150 µm. In order to enhance the film thickness uniformity on a substrate surface, a solvent may be dropped onto the substrate before applying the photo-curable resin composition (pre-wetting method). The solvent to be dropped and the amount thereof can be appropriately selected in accordance with need. Organic solvents used as a usual solvent are preferable, including alcohols such as isopropyl alcohol (IPA), ketones such as cyclohexanone, and glycols such as propylene glycol monomethyl ether. It is also possible to use the solvent used for the photo-curable resin composition.

In this case, the solvent may be preliminary evaporated by pre-heating (pre-baking: PB) in accordance with needs for efficient photo-curing. The pre-baking can be performed at 40 to 140° C. for about 1 minute to 1 hour, for example.

Then, (ii) the photo-curable resin layer is exposed via a photomask. The exposure wavelength is generally to 600 nm, preferably 10 to 600 nm, particularly preferably 190 to 500 nm. The photomask may be the one in which a desired pattern is bored, for example. The material of the photomask is not particularly limited. It is preferable to use the one that can shield the light having the foregoing wavelength, which includes chromium and so on, for example, but not limited thereto. The light having the foregoing wavelength may be exemplified by various lights having different wavelengths generated from, for example, a radiation-beam generating instrument including ultraviolet lights such as a g-beam, a h-beam, and an i-beam, and far ultraviolet lights (248 nm and 193 nm). The wavelength is preferably in the range of 248 to 436 nm. The exposure dose is preferably in the range of 10 to 10,000 mJ/cm$^2$.

Then, in order to enhance the development sensitivity, the post-exposure baking (PEB) may be carried out. The post-exposure baking is preferably performed at 40 to 150° C. for 0.5 to 10 minutes. Such baking makes the exposed part be crosslinked to form the pattern that is insoluble in the solvent, which are developers that will be described below.

After the post-exposure baking, (iii) development is performed by using a developer, thereby dissolving and removing the unexposed portion to form a pattern. As the developer, organic solvents used as a usual solvent are preferable, including alcohols such as isopropyl alcohol (IPA), ketones such as cyclohexanone, and glycols such as propylene glycol monomethyl ether. It is also possible to use the solvent used for the photo-curable resin composition. The development may be done by a usual method, for example, by soaking the substrate formed with a pattern into the foregoing developer. Then, if necessary, washing, rinsing, drying, and so forth are carried out to give a film of the photo-curable resin composition having an intended pattern.

The inventive photo-curable resin composition can also be used as an adhesive for bonding two substrates, which bond a substrate having a film of the inventive composition formed thereon with the second substrate so as to form an adherent bonding between the two substrate under an appropriate conditions of heat and pressure. Either or both of the substrate having the film formed thereon and the second substrate can be processed to chips by dicing, etc. As the bonding conditions, the heating is preferably performed at a temperature of 50 to 200° C. for 1 to 60 minutes. It is also possible to use a wafer bonder as a bonding apparatus to bond wafers under reduced pressure while applying load, or to use a flip chip bonder to perform chip-wafer bonding or chip-chip bonding. The adhesive layer formed between the substrates enhances the bond strength by the post-cure described below to form a permanent bond.

Then, the patterned substrate and the bonded substrate after pattering is preferably post cured at 100 to 250° C., particularly 150 to 220° C. by using an oven or a hot plate as the step of (iv). The inventive photo-curable resin composition can give a cured material layer which is excellent in various film properties even in a post-cure at a relatively low temperature of about 200° C. The post-cure temperature of 100 to 250° C. can increase the crosslink density of the photo-curable resin composition and can remove the remaining volatile components, thereby being preferable in view of the adhesion properties to a substrate, heat resistance, strength, electric properties, and bonding strength. The post cure makes the laminated (bonded) substrate have a resin film with increased crosslink density, whereby the adhesion strength between each substrates can be enhanced. In the present invention, the crosslinking reaction proceeds without generating side reaction attended by degassing, whereby lamination defects (voids) are not induced particularly when the resin composition is used as an adhesive for substrates. The post cure time can be 10 minutes to 10 hours, particularly 10 minutes to 3 hours. The film thickness of a post-cured film (cured film) obtained from the inventive photo-curable resin composition is generally 1 to 200 μm, preferably 5 to 50 μm.

By the way, when the patterning is not necessary, for example, when a simple uniform film is intended, the film formation may be performed by adopting a step of exposing the photo-curable resin layer to light having an appropriate wavelength without using the photomask as the step (ii) in the foregoing patterning process.

Photo-Curable Dry Film

The inventive photo-curable dry film is a photo-curable dry film in which the inventive photo-curable resin composition is applied onto a support film and dried.

The inventive photo-curable dry film (a support film and a photo-curable resin layer) is solid, and the photo-curable resin layer does not contain solvent, thereby having no possibility that volatilized solvent causes voids remained in the photo-curable resin layer or between the layer and an uneven substrate. There is an appropriate range of the film thickness in view of the flatness on an uneven substrate and covering of the uneven surface or a distance between laminated substrates. Accordingly, the photo-curable resin layer preferably has a film thickness of 5 to 200 μm, particularly 10 to 100 μm in view of the flatness, covering of the uneven surface, and a distance between laminated substrates.

In the photo-curable resin layer, the viscosity coefficient and the fluidity are closely interrelated; and thus, the photo-curable resin layer can express a proper fluidity in a proper range of the viscosity coefficient, so that it can penetrate deep into a narrow space and can enhance the adhesion properties to a substrate by softening the resin. Accordingly, the photo-curable resin layer can has a viscosity of 10 to 5,000 Pa·s, preferably 30 to 2,000 Pa·s, particularly 50 to 300 Pa·s at the temperature of 80 to 120° C. in view of the fluidity of the photo-curable resin layer.

When the inventive photo-curable dry film is brought into close contact with an uneven substrate (e.g., a substrate having either or both of a trench and a hole with an aperture width of 10 to 100 μm and a depth of 10 to 120 μm), the unevenness is followed by the photo-curable resin layer and covered, and high flatness can be achieved thereby. Particularly, when the photo-curable resin layer in the present invention is mainly composed of the inventive photo-curable resin composition, featuring low surface tension, higher flatness can be achieved. When the photo-curable resin layer is brought into close contact with the substrate under vacuum conditions, these voids can be prevented more efficiently.

Hereinafter, the production method of the inventive photo-curable dry film will be described. As to the manufacturing equipment for the photo-curable dry film, a film coater that is generally used for producing an adhesive product may be used. Illustrative examples of the film coater include a comma coater, a comma reverse coater, a multi coater, a die coater, a lip coater, a lip reverse coater, a direct gravure coater, an offset gravure coater, a 3-roll bottom reverse coater, and a 4-roll bottom reverse coater.

The support film is rolled-out from a roll-out axis of the film coater; and when it is passing through a coater head of the film coater, the photo-curable resin composition is applied onto the support film with a prescribed thickness to form the photo-curable resin layer; and then, it is passed through a hot-air circulating oven at a prescribed temperature for a prescribed period to dry and form the photo-curable resin layer on the support film; whereby the photo-curable dry film can be obtained. It is also possible to produce the photo-curable dry film having a protective film in accordance with need by passing the photo-curable dry film through a laminate roll together with the protective film that has been rolled-out from another roll-out axis of the film coater under a prescribed pressure, thereby bonding the protective film to the photo-curable resin layer on the support film, and subsequent roll-up to a roll-up axis of the film coater. In this case, temperature of the hot-air circulating oven is preferably in the range of 25 to 150° C., the period for passing through is preferably in the range of 1 to 100 minutes, and the laminate roll pressure is preferably in the range of 0.01 to 5 MPa.

The support film used in the inventive photo-curable dry film may be a monolayer or a multilayer film having plural polymer films being laminated. The material thereof may be exemplified by a synthetic resin film such as polyethylene, polypropylene, polycarbonate, and polyethylene terephthalate, etc. Among them, polyethylene terephthalate is preferable because it has appropriate flexibility, mechanical strength, and heat resistance. These films may be variously subjected to, for example, corona treatment and coating treatment with a releasing agent. For this, many commercial films may be used. Illustrative examples thereof include Cerapeel WZ (RX) and Cerapeel BX8 (R) (both are product of Toray Advanced Film Co., Ltd.), E7302 and E7304 (both are product of Toyobo Co., Ltd.), Purex G31 and Purex G71T1 (both are product of Teijin DuPont Films Japan Ltd.), and PET38×1-A3, PET38×1-V8, and PET38×1-X08 (all product of Nippa Co., Ltd.).

On the other hand, the protective film used for protecting the inventive photo-curable dry film may be the same film as the above-mentioned support film, but polyethylene terephthalate and polyethylene having appropriate flexibility are preferred. For this, commercial films may be used, and illustrative examples thereof include the polyethylene terephthalates that have already been exemplified, polyethylene such as GF-8 (product of Tamapoly Co., Ltd.) and PE Film 0-Type (product of Nippa Co., Ltd.).

The thicknesses of the support film and the protective film are preferably both in the range of 10 to 100 μm, particularly preferably 25 to 50 μm, in view of stable production of the photo-curable dry film and the rolling habit around a roll axis, so-called curl-prevention.

Patterning Process by Using Photo-Curable Dry Film

The patterning process by using the photo-curable dry film is a patterning process, comprising:

(i) a step of bringing the inventive photo-curable dry film into close contact with a substrate to form the photo-curable resin layer on the substrate, (ii) a step of exposing the photo-curable resin layer via a photomask, and (iii) a step of development by using a developer after heat treatment subsequent to the exposing, thereby dissolving and removing an unexposed portion to form a pattern.

It is preferable to include (iv) a step of subjecting a film patterned by the development to post-cure at a temperature of 100 to 250° C.

First, the photo-curable resin layer is formed on a substrate in (i) by bringing the photo-curable resin layer of the photo-curable dry film into close contact with the substrate, after delaminating a protective film from the photo-curable dry film when the protective film is laminated. The photo-curable dry film can be brought into close contact with a substrate by using a film adhering equipment, for example.

The substrate may be exemplified by a silicon wafer, a silicon wafer for a through-silicon via, a silicon wafer thinned by back-side polishing, a substrate made of plastics or ceramics, and a substrate with the surface entirely or partly having a metal such as Ni and Au by an ion sputtering method or a plating method. The substrate having either or both of a trench and a hole with an aperture width of 10 to 100 μm and a depth of 10 to 120 μm can be used. As to the film adhering equipment, a vacuum laminator is preferred. For example, the protective film of the photo-curable dry film is delaminated, and the photo-curable resin layer thereby exposed is brought into close contact with the substrate on a table at a prescribed temperature by using an adhering roll under a prescribed pressure in a vacuum chamber with a prescribed degree of vacuum. It is to be noted that the temperature of the table is preferably in the range of 60 to 120° C., the pressure of the adhering roll is preferably in the range of 0 to 5.0 MPa, and the degree of vacuum in the vacuum chamber is preferably in the range of 50 to 500 Pa.

In order to obtain the photo-curable resin layer with a necessary film thickness, the films may be adhered in plural times in accordance with need. For example, about 1 to 10 times of the adhesion can give the photo-curable resin layer with the thickness of about 10 to 1,000 μm, particularly about 100 to 500 μm.

If necessary, pre-heat (pre-bake) may be carried out in order to effectively carry out the photo-curing reaction of the photo-curable resin layer as well as to enhance the adhesion properties between the photo-curable resin layer and the substrate. The pre-bake may be carried out, for example, at 40 to 140° C. for 1 minute to 1 hour approximately. The photo-curable resin layer adhered on the substrate can be subjected to (ii) exposure, (iii) development, bonding of the substrates if needed, and (iv) post-cure as in the application of the photo-curable resin composition onto a substrate. Incidentally, the support film of the photo-curable dry film is delaminated or removed by other methods before the pre-bake or before the PEB in accordance with the process.

The cured film made from the photo-curable resin composition and the photo-curable dry film is excellent in heat resistance, flexibility, electric insulation, mechanical properties, and adhesion properties to a substrate; and can be used for a film to protect electric and electronic parts such as a semiconductor device and a film for bonding substrates.

Laminate

The inventive laminate is a laminate comprising: a substrate having either or both of a trench and a hole with an aperture width of 10 to 100 μm and a depth of 10 to 120 μm, and a cured material layer made from the inventive photo-curable resin composition or a cured material of the photo-curable resin layer in the inventive photo-curable dry film, being formed on the substrate.

Such a laminate with the cured material layer being formed by using the inventive photo-curable resin composition or the inventive photo-curable dry film is excellent in adhesion properties between the cured material layer and a substrate, and has high flatness even when the substrate has such unevenness as described above.

EXAMPLES

Hereinafter, the present invention will be explained more specifically by showing Synthesis Examples, Examples, and Comparative Examples, but the present invention is not limited to the following Examples.

In the following Synthesis Examples, the weight average molecular weight of each polymer was measured by gel permeation chromatography (GPC) in terms of monodispersed polystyrene as a standard by using a GPC column of TSK gel Super HZM-H (product of Tosoh Corporation) under analysis conditions of a flow rate of 0.6 ml/min, an eluting solvent of tetrahydrofuran, and a column temperature of 40° C.

Compounds to be used in Synthesis Examples and Comparative Synthesis Examples are shown below.

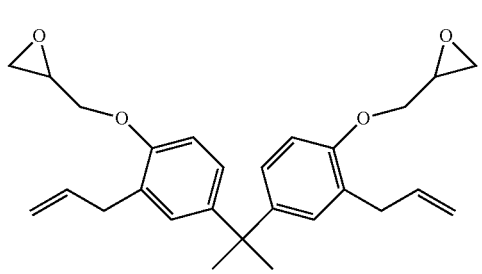

(S-1)

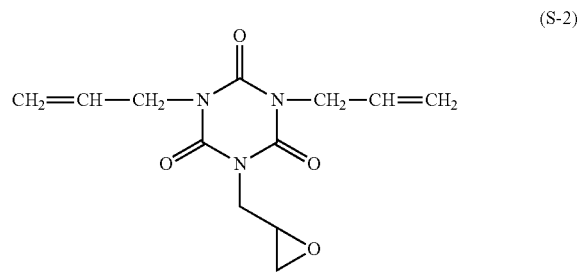

(S-2)

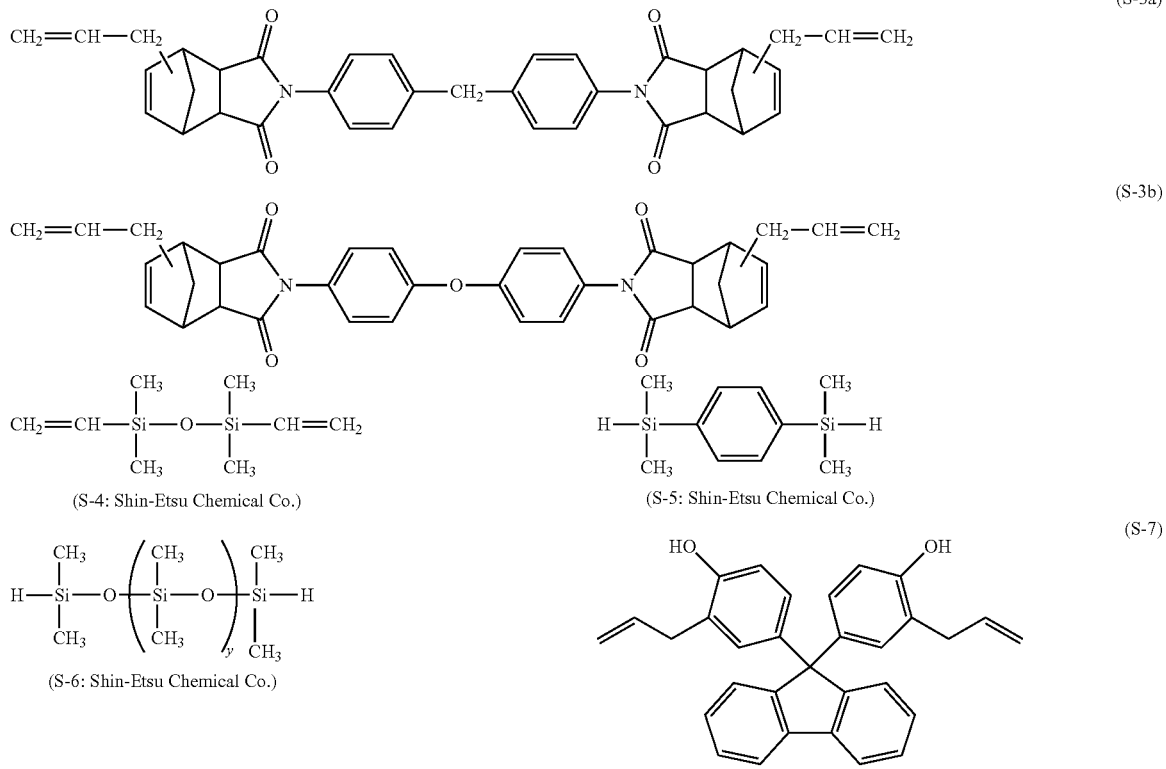

(S-3a)

(S-3b)

(S-4: Shin-Etsu Chemical Co.)

(S-5: Shin-Etsu Chemical Co.)

(S-6: Shin-Etsu Chemical Co.)

(S-7)

Synthesis Example 1

Into a 3 L flask equipped with a stirrer, a thermometer, a nitrogen inflow instrument, and a reflux condenser, 135.5 g (0.25 mol) of a compound shown by the formula (S-1), 28.5 g (0.05 mol) of a compound shown by the formula (S-3a), and 86.0 g (0.2 mol) of a compound shown by the formula (5-7) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 604.0 g (0.20 mol) of a compound shown by the formula (S-6) (y=40) were added dropwise over 1 hour (total molar number of the hydrosilyl groups/total molar number of the alkenyl groups=1/1, silicone content: 69.1% by mass; when the molar number "f" of S-3a was assumed to be 1, d=4, c+e=5, and g=0). After completion of the dropwise addition, the mixture was heated to 100° C. and aged for 6 hours. Then, toluene was evaporated from the reaction solution under reduced pressure to give a product with a weight average molecular weight of 42,000 measured by GPC in terms of polystyrene. The obtained resin was defined as Resin (1), and was used for Examples. Incidentally, the obtained resin was determined as the resin shown by the general formula (1) by $^1$H NMR (product of Bruker Corporation).

Synthesis Example 2

Into a 3 L flask equipped with a stirrer, a thermometer, a nitrogen inflow instrument, and a reflux condenser, 66.3 g (0.25 mol) of a compound shown by the formula (S-2), 28.5 g (0.05 mol) of a compound shown by the formula (S-3a), and 86.0 g (0.20 mol) of a compound shown by the formula (S-7) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 604.0 g (0.20 mol) of a compound shown by the formula (S-6) (y=40) were added dropwise over 1 hour (total molar number of the hydrosilyl groups/total molar number of the alkenyl groups=1/1, silicone content: 71.7% by mass; when the molar number "f" of S-3a was assumed to be 1, d=4, c+e=5, and g=0). After completion of the dropwise addition, the mixture was heated to 100° C. and aged for 6 hours. Then, toluene was evaporated from the reaction solution under reduced pressure to give a product with a weight average molecular weight of 45,000 measured by GPC in terms of polystyrene. The obtained resin was defined as Resin (2), and was used for Examples. Incidentally, the obtained resin was determined as the resin shown by the general formula (1) by $^1$H NMR (product of Bruker Corporation).

Synthesis Example 3

Into a 3 L flask equipped with a stirrer, a thermometer, a nitrogen inflow instrument, and a reflux condenser, 53.0 g (0.20 mol) of a compound shown by the formula (S-2), 57.0 g (0.10 mol) of a compound shown by the formula (S-3a), and 86.0 g (0.20 mol) of a compound shown by the formula (S-7) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 604.0 g (0.20 mol) of a compound shown by the formula (S-6) (y=40) were added dropwise over 1 hour (total molar number of the hydrosilyl groups/total molar number of the alkenyl groups=1/1, silicone content: 70.4% by mass; when the molar number "f" of S-3a was assumed to be 1, d=2, c+e=2, and g=0). After completion of the dropwise addition, the mixture was heated to 100° C. and aged for 6 hours. Then, toluene was evaporated from the reaction solution under reduced pressure to give a product with a weight average molecular weight of 44,000 measured by GPC in terms of polystyrene. The obtained resin was defined as Resin (3), and was used for Examples. Incidentally, the obtained resin was determined as the resin shown by the general formula (1) by $^1$H NMR (product of Bruker Corporation).

Synthesis Example 4

Into a 3 L flask equipped with a stirrer, a thermometer, a nitrogen inflow instrument, and a reflux condenser, 26.5 g (0.10 mol) of a compound shown by the formula (S-2), 57.0 g (0.10 mol) of a compound shown by the formula (S-3a), 18.6 g (0.10 mol) of a compound shown by the formula (S-4), and 86.0 g (0.20 mol) of a compound shown by the formula (S-7) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 317 g (0.20 mol) of a compound shown by the formula (S-6) (y=20) were added dropwise over 1 hour (total molar number of the hydrosilyl groups/total molar number of the alkenyl groups=1/1, silicone content: 56.3% by mass; when the molar number "f" of S-3a was assumed to be 1, d=2, c+e=1, and g=1). After completion of the dropwise addition, the mixture was heated to 100° C. and aged for 6 hours. Then, toluene was evaporated from the reaction solution under reduced pressure to give a product with a weight average molecular weight of 40,000 measured by GPC in terms of polystyrene. The obtained resin was defined as Resin (4), and was used for Examples. Incidentally, the obtained resin was determined as the resin shown by the general formula (1) by $^1$H NMR (product of Bruker Corporation).

Synthesis Example 5

Into a 3 L flask equipped with a stirrer, a thermometer, a nitrogen inflow instrument, and a reflux condenser, 135.5 g (0.25 mol) of a compound shown by the formula (S-1), 28.5 g (0.05 mol) of a compound shown by the formula (S-3b), and 86.0 g (0.2 mol) of a compound shown by the formula (S-7) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 604.0 g (0.20 mol) of a compound shown by the formula (S-6) (y=40) were added dropwise over 1 hour (total molar number of the hydrosilyl groups/total molar number of the alkenyl groups=1/1, silicone content: 69.0% by mass; when the molar number "f" of S-3b was assumed to be 1, d=4, c+e=5, and g=0). After completion of the dropwise addition, the mixture was heated to 100° C. and aged for 6 hours. Then, toluene was evaporated from the reaction solution under reduced pressure to give a product with a weight average molecular weight of 43,000 measured by GPC in terms of polystyrene. The obtained resin was defined as Resin (5), and was used for Examples. Incidentally, the obtained resin was determined as the resin shown by the general formula (1) by $^1$H NMR (product of Bruker Corporation).

Synthesis Example 6

Into a 3 L flask equipped with a stirrer, a thermometer, a nitrogen inflow instrument, and a reflux condenser, 66.3 g (0.25 mol) of a compound shown by the formula (S-2), 28.5 g (0.05 mol) of a compound shown by the formula (S-3b), and 86.0 g (0.20 mol) of a compound shown by the formula (S-7) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 604.0 g (0.20 mol) of a compound shown by the formula (S-6) (y=40) were added dropwise over 1 hour (total molar number of the hydrosilyl groups/total molar number of the alkenyl groups=1/1, silicone content: 71.7% by mass; when the molar number "f" of S-3b was assumed to be 1, d=4, c+e=5, and g=0). After completion of the dropwise addition, the mixture was heated to 100° C. and aged for 6 hours. Then, toluene was evaporated from the reaction solution under reduced pressure to give a product with a weight average molecular weight of 44,000 measured by GPC in terms of polystyrene. The obtained resin was defined as Resin (6), and was used for Examples. Incidentally, the obtained resin was determined as the resin shown by the general formula (1) by $^1$H NMR (product of Bruker Corporation).

Synthesis Example 7

Into a 3 L flask equipped with a stirrer, a thermometer, a nitrogen inflow instrument, and a reflux condenser, 108.4 g (0.20 mol) of a compound shown by the formula (S-1), 53.0 g (0.20 mol) of a compound shown by the formula (S-2), and 57.0 g (0.10 mol) of a compound shown by the formula (S-3a) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 604.0 g (0.20 mol) of a compound shown by the formula (S-6) (y=40) were added dropwise over 1 hour (total molar number of the hydrosilyl groups/total molar number of the alkenyl groups=1/1, silicone content: 68.6% by mass; when the molar number "f" of S-3a was assumed to be 1, d=0, c+e=4, and g=0). After completion of the dropwise addition, the mixture was heated to 100° C. and aged for 6 hours. Then, toluene was evaporated from the reaction solution under reduced pressure to give a product with a weight average molecular weight of 43,000 measured by GPC in terms of polystyrene. The obtained resin was defined as Resin (7), and was used for Examples. Incidentally, the obtained resin was determined as the resin shown by the general formula (1) by $^1$H NMR (product of Bruker Corporation).

Comparative Synthesis Example 1

Into a 3 L flask equipped with a stirrer, a thermometer, a nitrogen inflow instrument, and a reflux condenser, 135.5 g (0.25 mol) of a compound shown by the formula (S-1), 9.3 g (0.05 mol) of a compound shown by the formula (S-4), and 86.0 g (0.20 mol) of a compound shown by the formula (S-7) was introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 604.0 g (0.20 mol) of a compound shown by the formula (5-6) (y=40) were added dropwise over 1 hour (total molar number of the hydrosilyl groups/total molar number of the alkenyl groups=1/1, silicone content: 70.6% by mass; the molar number "f" of S-3 was such that f=0 since any S-3s were not contained). After completion of the dropwise addition, the mixture was heated to 100° C. and aged for 6 hours. Then, toluene was evaporated from the reaction solution under reduced pressure to give a product with a weight average molecular weight of 41,000 measured by GPC in terms of polystyrene. The obtained resin was defined as Resin (8), and was used for Comparative Examples.

Comparative Synthesis Example 2

Into a 3 L flask equipped with a stirrer, a thermometer, a nitrogen inflow instrument, and a reflux condenser, 66.3 g (0.25 mol) of a compound shown by the formula (S-2), 9.3 g (0.05 mol) of a compound shown by the formula (S-4), and 86.0 g (0.20 mol) of a compound shown by the formula (S-7) were introduced. Then, 2,000 g of toluene was added thereto, and the mixture was heated to 70° C. Subsequently, 1.0 g of toluene solution of chloroplatinic acid (platinum concentration of 0.5% by mass) was introduced, and 58.2 g (0.30 mol) of a compound shown by the formula (S-5) and 604.0 g (0.20 mol) of a compound shown by the formula (S-6) (y=40) were added dropwise over 1 hour (total molar number of the hydrosilyl groups/total molar number of the alkenyl groups=1/1, silicone content: 73.3% by mass; the molar number "f" of S-3 was such that f=0 since any S-3s were not contained). After completion of the dropwise addition, the mixture was heated to 100° C. and aged for 6 hours. Then, toluene was evaporated from the reaction solution under reduced pressure to give a product with a weight average molecular weight of 46,000 measured by GPC in terms of polystyrene. The obtained resin was defined as Resin (9), and was used for Comparative Examples.

Examples 1 to 12 and Comparative Examples 1 to 2

<Preparation of Photo-curable Resin Composition>

In accordance with the formulation amounts described in Table 1, each of the silicone resins (each Resin), the photo-acid generator, the crosslinking agents, the solvent, and the basic compound were formulated. This was stirred, mixed, and dissolved at a normal temperature; and then subjected to precise filtration with a 1.0 μm filter made of Teflon (registered trademark) to give each photo-curable resin composition of Examples 1 to 12 and Comparative Examples 1 to 2. Incidentally, the unit of each value showing the formulation amount in Table 1 is "parts by mass".

TABLE 1

| | Components | | Examples | | | | | | | | | | | | Comparative Examples | |
|---|---|---|---|---|---|---|---|---|---|---|---|---|---|---|---|---|
| | | | 1 | 2 | 3 | 4 | 5 | 6 | 7 | 8 | 9 | 10 | 11 | 12 | 1 | 2 |
| A | Inventive Silicone | Resin (1) | 100 | — | — | — | — | — | — | — | 100 | 100 | 100 | 100 | — | — |
| | | Resin (2) | — | 100 | — | — | — | — | — | — | — | — | — | — | — | — |
| | | Resin (3) | — | — | 100 | — | — | — | — | 100 | — | — | — | — | — | — |
| | | Resin (4) | — | — | — | 100 | — | — | — | — | — | — | — | — | — | — |
| | | Resin (5) | — | — | — | — | 100 | — | — | — | — | — | — | — | — | — |
| | | Resin (6) | — | — | — | — | — | 100 | — | — | — | — | — | — | — | — |
| | | Resin (7) | — | — | — | — | — | — | 100 | — | — | — | — | — | — | — |
| | Other Silicone | Resin (8) | — | — | — | — | — | — | — | — | — | — | — | — | 100 | — |
| | | Resin (9) | — | — | — | — | — | — | — | — | — | — | — | — | — | 100 |
| B | Photo-acid generator | PAG-1 | 1 | 1 | 1 | 1 | 1 | 1 | 1 | 1 | 0.1 | 10 | 1 | 1 | 1 | 1 |
| C | Crosslinking agent | CL-1 | 10 | 10 | 10 | 10 | 10 | 10 | 10 | 10 | 10 | 10 | 25 | 1 | 10 | 10 |
| | | CL-2 | 3 | 3 | 3 | 3 | 3 | 3 | 3 | 3 | 3 | 3 | 5 | 1 | 3 | 3 |
| D | Solvent | Cyclopentanone | 55 | 55 | 55 | 55 | 55 | 55 | 55 | 55 | 55 | 55 | 55 | 55 | 55 | 55 |
| E | Basic compound | AM-1 | — | — | — | — | — | — | — | 0.1 | — | — | — | — | — | — |

The photo-acid generator described in Table 1 is as follows.

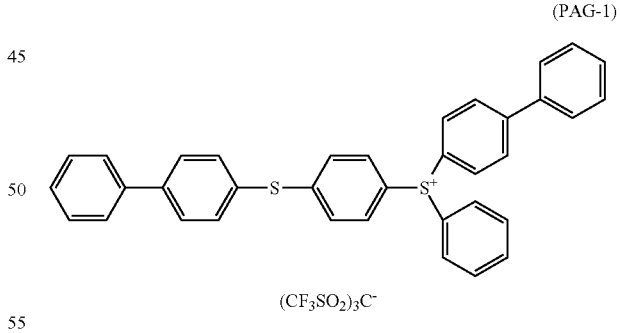

(PAG-1)

The crosslinking agents described in Table are as follows.

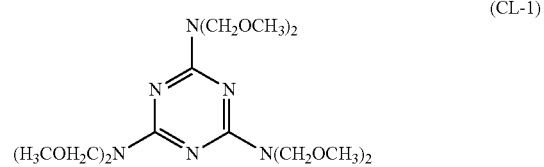

(CL-1)

-continued

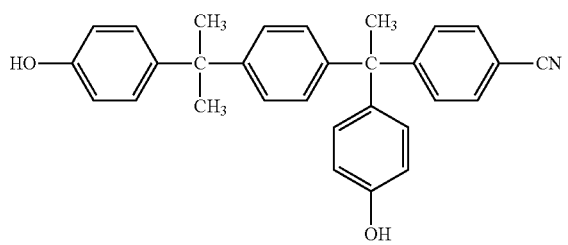
(CL-2)

The basic compound described in Table 1 is as follows.

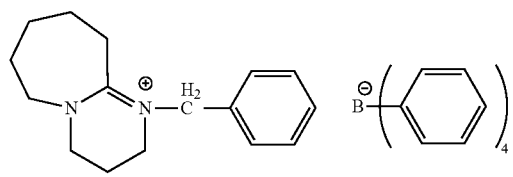
(AM-1)

Preparation of Photo-curable Dry Film

By using a die coater as a film coater and a polyethylene terephthalate film (thickness: 38 μm) as a support film, each of the photo-curable resin compositions of Examples 1 to 12 and Comparative Examples 1 to 2 was applied onto the support film. Then, each was passed through a hot-air circulating oven (length of 4 m) set to 100° C. over 5 minutes and dried to form a photo-curable resin layer on the support film, whereby each photo-curable dry film was obtained. Thereafter, a polyethylene film (thickness: 50 μm) was laminated as a protective film onto the photo-curable resin layer by using a laminate roll under pressure of 1 MPa to produce a photo-curable dry film having a protective film. The film thickness of each photo-curable resin layer is described in Table 2. Incidentally, the film thickness was measured with an optical interference film thickness gauge.

From each photo-curable dry film with a protective film of Examples 1 to 12 and Comparative Examples 1 to 2, the protective film was delaminated. The photo-curable resin layer on the support film was brought into close contact with a substrate for migration test (a comb shaped electrode substrate in which conductive material was copper, the distance between the conductive portions and the width of the conductive portion were 20 μm, and the thickness of the conductive portion was 4 μm) by using a vacuum laminator TEAM-100RF (manufactured by Takatori Corp.) with the vacuum degree in the vacuum chamber being set to 80 Pa. The temperature condition was set to 110° C. After the pressure was resumed to normal pressure, the substrate was taken out from the vacuum laminator, and then, the support film was delaminated. Then, this was pre-baked at 130° C. for 5 minutes with a hot plate in order to improve the adhesion properties to the substrate. The obtained photo-curable resin layer was exposed at the exposure conditions of 405 nm by using a contact aligner type exposure apparatus via a mask in order to form a line-and-spade pattern and a contact hole pattern. After the light irradiation, the PEB thereof was carried out on a hot plate at 120° C. for 5 minutes and cooled. The substrate was subjected to 300-seconds spray development with propylene glycol monomethyl ether acetate (PGMEA) to form a pattern.

The photo-curable resin layer on the substrate having a pattern formed by the foregoing method was post-cured by using an oven at 180° C. for 2 hours while purging therein with nitrogen. Subsequently, on the formed contact hole patterns having a size of 100 μm, 80 μm, 60 μm, 40 μm, and 20 μm, the cross sections were observed under a scanning electron microscope (SEM); and the minimum hole pattern with the hole being penetrated to the film bottom was determined to threshold F. The vertical of the contact hole pattern of 80 μm was evaluated on the basis of the obtained photograph of the cross section, and a vertical pattern was rated as "Excellent", a slightly reverse taper shape was rated as "Good", a reverse taper shape was rated as "Fair", and an opening defect was rated as "Bad".

Electric property (Dielectric Breakdown Strength)

In order to evaluate dielectric breakdown strength of a cured film composed of the photo-curable resin composition, each of the photo-curable resin compositions of Examples 1 to 12 and Comparative Examples 1 to 2 was applied onto an iron plate in a size of 13 cm×15 cm and the thickness of 0.7 mm by using a bar coater, and heated in an oven at 180° C. for 2 hours to give a cured film. The photo-curable resin compositions were applied so as to have each film thickness of 0.2 μm after curing. By using these cured films, the dielectric breakdown strength of the cured film of each photo-curable resin composition was measured with a dielectric breakdown testing machine TM-5031AM (manufactured by Tamadensoku Co., Ltd.).

Reliability (Adhesion Properties, Crack Resistance)

The wafer with each of the cured photo-curable resin films of Examples 1 to 12 and Comparative Examples 1 to 2 was cut to give a test piece in a size of 10 mm×10 mm square by using a dicing saw (DAD685, product of DISCO CORPORATION, spindle rotation speed: 40,000 rpm, cutting rate: 20 mm/sec) equipped with a dicing blade. The obtained test pieces (10 pieces for each) were applied to a heat cycle test (repeated 1000 cycles of holding at −25° C. for 10 minutes and holding at 125° C. for 10 minutes) to determine the state of peeling of the resin film from the wafer and existence or nonexistence of a crack after the heat cycle test. The example which showed no peeling and no crack was rated as "Good", the example in which at least one test piece showed peeling was rated as "Peel", and the example in which at least one test piece showed a crack was rated as "Crack".

Heat Resistance

On the test piece produced in the foregoing reliability evaluation, the weight before testing was measured. Subsequently, the test piece was left in an oven heated to 200° C. for 1000 hours. Then, the test piece was taken out from the oven, and the weight after testing was measured. The example in which the weight change was less than 0.5% by mass before and after the testing was judged as "Good", and the example in which the weight change was 0.5% by mass or more before and after the testing was judged as "Bad".

Table 2 shows the results of performance evaluations of the cured films and the photo-curable dry films of Examples and Comparative examples of the present invention.

TABLE 2

| | Examples | | | | | | | | | | | | Comparative Examples | |
|---|---|---|---|---|---|---|---|---|---|---|---|---|---|---|
| | 1 | 2 | 3 | 4 | 5 | 6 | 7 | 8 | 9 | 10 | 11 | 12 | 1 | 2 |
| Film thickness of resin layer (μm) | 100.5 | 100.7 | 99.9 | 101.0 | 100.2 | 99.7 | 100.5 | 99.8 | 100.4 | 98.9 | 99.4 | 100.8 | 100.9 | 100.5 |
| Pattern shape of Contact hole | Good | Good | Good | Good | Good | Good | Good | Exellent | Good | Good | Good | Good | Good | Good |
| Resolution Threshold F (μm) | 80 | 80 | 80 | 80 | 80 | 80 | 100 | 60 | 60 | 100 | 100 | 80 | 100 | 100 |
| Electric property Dielectric breakdown strength (V/μm) | 520 | 560 | 550 | 490 | 525 | 565 | 545 | 570 | 500 | 530 | 570 | 585 | 530 | 580 |
| Reliability Peel | Good | Good | Good | Good | Good | Good | Good | Good | Good | Good | Good | Good | Peel Crack | Peel Crack |
| Crack Heat resistance | Good | Good | Good | Good | Good | Good | Good | Good | Good | Good | Good | Good | Bad | Bad |

From the foregoing results, it was revealed that each composition of Examples 1 to 12 is closely free from film loss, and shows excellent resolution and sufficient properties as a photosensitive material. It was also revealed that the cured film (the cured material layer) has high heat resistance and electric properties such as dielectric breakdown strength, excellent adhesion properties and crack resistance in a heat cycle test, and is useful as a protective film for circuits and electronic parts. This can provide a photocurable dry film with higher reliability.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A silicone skeleton-containing polymer comprising a silicone skeleton shown by the following formula (1) and having a weight average molecular weight of 3,000 to 500,000,

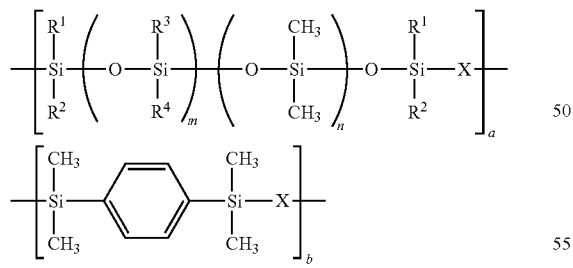

(1)

wherein $R^1$ to $R^4$ each independently represent a monovalent hydrocarbon group having 1 to 8 carbon atoms; "m" and "n" are each independently an integer of 0 to 300; the both of "a" and "b" are positive numbers satisfying a+b=1; each of "X" independently represents a linking group selected from the divalent groups shown by the following general formulae (2), (3), (4), (5), or (6), and the molar numbers of units shown by the following general formulae (2), (3), (4), (5), and (6) are defined as "c", "d", "e", "f", and "g" respectively, each of "c", "d", "e", and "g" is 0 or a positive number, and "f" is a positive number, with the proviso that c+d+e is a positive number,

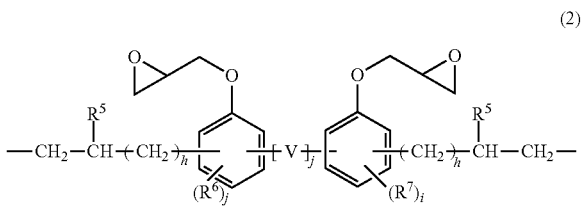

(2)

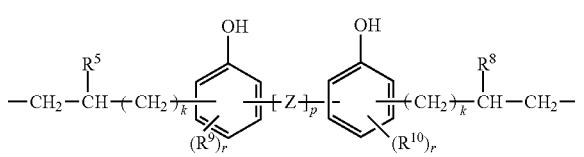

(3)

wherein "V" and "Z" each independently represent a divalent organic group selected from the following

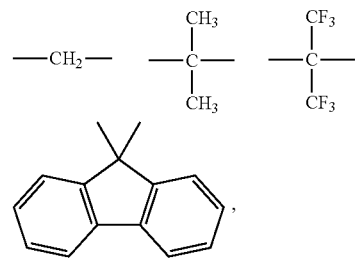

"j" and "p" are each independently 0 or 1, $R^5$ and $R^8$ each independently represents a hydrogen atom or a methyl group, "h" and "k" are each independently an integer of 0 to 7, $R^6$, $R^7$, $R^9$, and $R^{10}$ each independently represent the same or different group selected from alkyl groups or alkoxy groups having 1 to 4 carbon atoms, and "i" and "r" are each independently any of 0, 1, and 2;

(4)

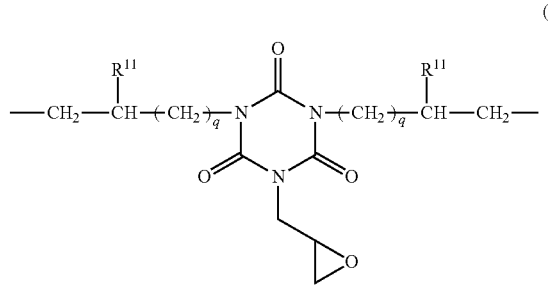

wherein $R^{11}$ represents a hydrogen atom or a methyl group, and "q" is an integer of 0 to 7, (5)

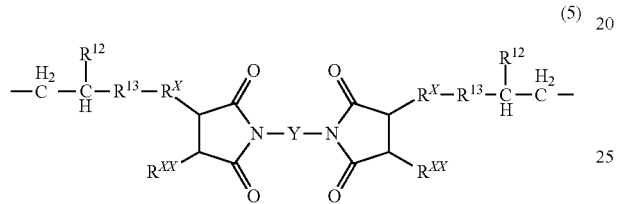

wherein "Y" is a divalent organic group, each of $R^{12}$ independently represents the same or different moiety selected from a hydrogen atom, monovalent hydrocarbon groups having 1 to 8 carbon atoms, or monovalent hydrocarbon groups having 1 to 8 carbon atoms partly substituted with a halogen atom, each of $R^{13}$ independently represents the same or different alkylene group having 1 to 8 carbon atoms, $R^x$ is a single bond or a group to form a ring structure with $R^{xx}$ by ring closure, and $R^{xx}$ is a hydrogen atom or a monovalent hydrocarbon group having 1 to 8 carbon atoms, (6)

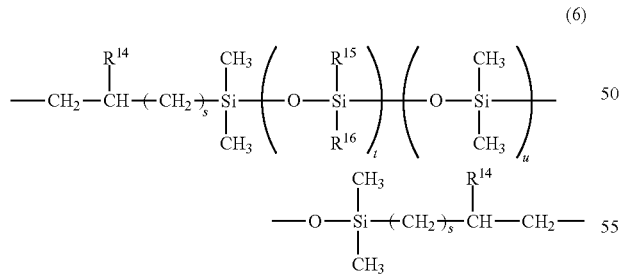

wherein "t" and "u" are each independently an integer of 0 to 300, $R^{14}$ represents a hydrogen atom or a methyl group, $R^{15}$ and $R^{16}$ each independently represent a monovalent hydrocarbon group having 1 to 8 carbon atoms, and "s" is an integer of 0 to 7.

2. The silicone skeleton-containing polymer according to claim 1, wherein the general formula (5) is the following formula (5-1)

(5-1)

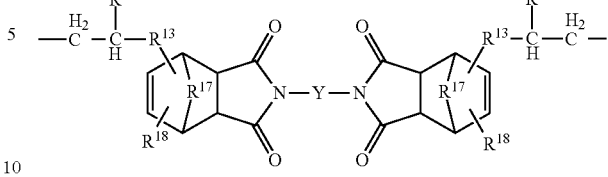

wherein "Y", $R^{12}$, and $R^{13}$ are the same as above, each of $R^{17}$ independently represents the same or different alkylene group having 1 to 8 carbon atoms, and each of $R^{18}$ independently represents the same or different moiety selected from a hydrogen atom, monovalent hydrocarbon groups having 1 to 8 carbon atoms, or monovalent hydrocarbon groups having 1 to 8 carbon atoms partly substituted with a halogen atom.

3. A photo-curable resin composition comprising:
the silicone skeleton-containing polymer (A) according to claim 2, and
a photo-acid generator (B) that is decomposable by light having a wavelength of 190 to 500 nm to generate an acid.

4. A photo-curable resin composition comprising:
the silicone skeleton-containing polymer (A) according to claim 1, and
a photo-acid generator (B) that is decomposable by light having a wavelength of 190 to 500 nm to generate an acid.

5. The photo-curable resin composition according to claim 4, further comprising a crosslinking agent (C).

6. The photo-curable resin composition according to claim 5, wherein the crosslinking agent (C) is any one or more species selected from amino condensates modified with formaldehyde or formaldehyde-alcohol, phenol compounds having on average two or more methylol groups or alkoxy methylol groups in a molecule thereof, or epoxy compounds having on average two or more epoxy groups in a molecule thereof.

7. The photo-curable resin composition according to claim 4, further comprising a solvent (D).

8. The photo-curable resin composition according to claim 4, further comprising a basic compound (E).

9. A photo-curable dry film comprising:
a support film, and
a photo-curable resin layer of the photo-curable resin composition according to claim 4 being applied onto the support film and dried.

10. A laminate comprising:
a substrate having either or both of a trench and a hole with an aperture width of 10 to 100 μm and a depth of 10 to 120 μm, and
a cured material layer made from a cured material layer of the photo-curable resin layer in the photo-curable dry film according to claim 9, being formed on the substrate.

11. A patterning process, comprising:
(i) a step of bringing the photo-curable dry film according to claim 9 into close contact with a substrate to form the photo-curable resin layer on the substrate,
(ii) a step of exposing the photo-curable resin layer via a photomask, and
(iii) a step of development by using a developer after heat treatment subsequent to the exposing, thereby dissolving and removing an unexposed portion to form a pattern.

12. The patterning process according to claim 11, further comprising (iv) a step of subjecting a film patterned by the development to post-cure at a temperature of 100 to 250° C.

13. The patterning process according to claim 11, wherein the substrate has either or both of a trench and a hole with an aperture width of 10 to 100 μm and a depth of 10 to 120 μm.

14. A laminate comprising:
   a substrate having either or both of a trench and a hole with an aperture width of 10 to 100 μm and a depth of 10 to 120 μm, and
   a cured material layer made from the photo-curable resin composition according to claim 4, being formed on the substrate.

15. A patterning process, comprising:
   (i) a step of applying the photo-curable resin composition according to claim 4 onto a substrate to form a photo-curable resin layer on the substrate,
   (ii) a step of exposing the photo-curable resin layer via a photomask, and
   (iii) a step of development by using a developer after heat treatment subsequent to the exposing, thereby dissolving and removing an unexposed portion to form a pattern.

16. The patterning process according to claim 15, further comprising (iv) a step of subjecting a film patterned by the development to post-cure at a temperature of 100 to 250° C.

17. The patterning process according to claim 15, wherein the substrate has either or both of a trench and a hole with an aperture width of 10 to 100 μm and a depth of 10 to 120 μm.

18. The photo-curable resin composition according to claim 4, wherein the photo-curable resin composition is a material for a film to protect electric and electronic parts.

19. The photo-curable resin composition according to claim 4, wherein the photo-curable resin composition is a material for a film for bonding two substrates.

* * * * *